United States Patent [19]

Kato et al.

[11] Patent Number: 5,132,537

[45] Date of Patent: Jul. 21, 1992

[54] IMAGE TRANSFER APPARATUS AND METHOD

[75] Inventors: Hirokazu Kato, Kanagawa; Mineo Ohta; Yutaka Jimbo, both of Tokyo, all of Japan

[73] Assignee: Fuji Photo Film Co., Ltd., Kanagawa, Japan

[21] Appl. No.: 685,795

[22] Filed: Apr. 16, 1991

[30] Foreign Application Priority Data

Apr. 19, 1990 [JP] Japan ................................. 2-103899

[51] Int. Cl.⁵ .............................................. G03C 5/16
[52] U.S. Cl. ...................................... 250/319; 250/318
[58] Field of Search ............... 250/318, 319, 317, 316

[56] References Cited

U.S. PATENT DOCUMENTS

| | | | |
|---|---|---|---|
| 3,129,328 | 4/1964 | Wedel | 250/319 |
| 3,687,551 | 8/1972 | Laursen | 250/319 |
| 3,823,317 | 7/1974 | Ritzerfeld | 250/318 |
| 4,659,927 | 4/1987 | Tago et al. | 250/318 |
| 4,962,314 | 10/1990 | Hirota et al. | 250/318 |

*Primary Examiner*—Jack I. Berman
*Attorney, Agent, or Firm*—Sughrue, Mion, Zinn Macpeak & Seas

[57] ABSTRACT

An image transfer apparatus for transferring an image recorded on an image sheet to an image-receiving sheet wherein the image sheet and the image-receiving sheet placed one above the other on a guide plate, together with the guide plate and a cover sheet having one end secured to the guide plate for covering the image sheet and the image-receiving sheet, are transported in one direction along a transporting passage and passed through a transfer station, and are subsequently transported in an opposite direction along the transporting passage and are passed again through the transfer station. The apparatus has a takeup device for drawing out the cover sheet as the guide plate is transported in one direction, and for taking up the cover sheet as the guide plate is transported in the opposite direction. Accordingly, it is unnecessary for the operator to manually cover the image sheet and the image-receiving sheet on the guide plate with the cover sheet prior to transfer or to remove the cover sheet from the guide plate after transfer.

20 Claims, 31 Drawing Sheets

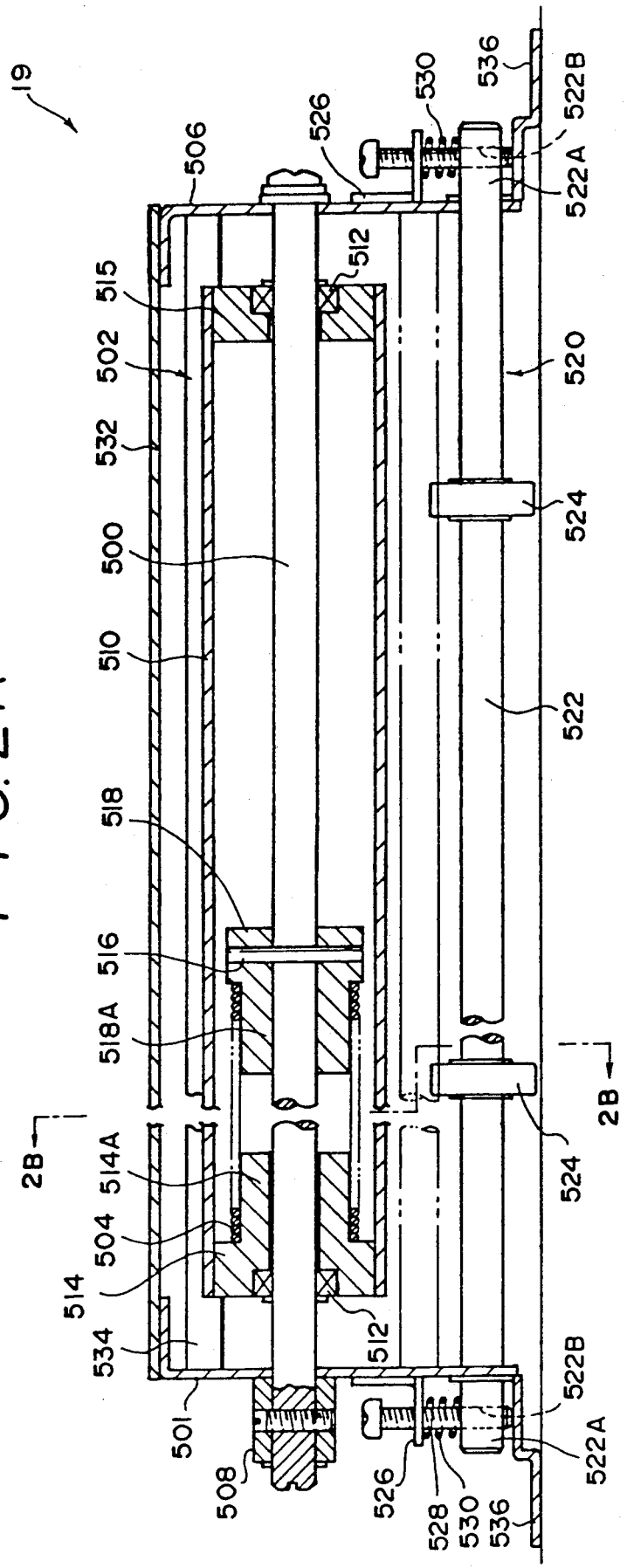

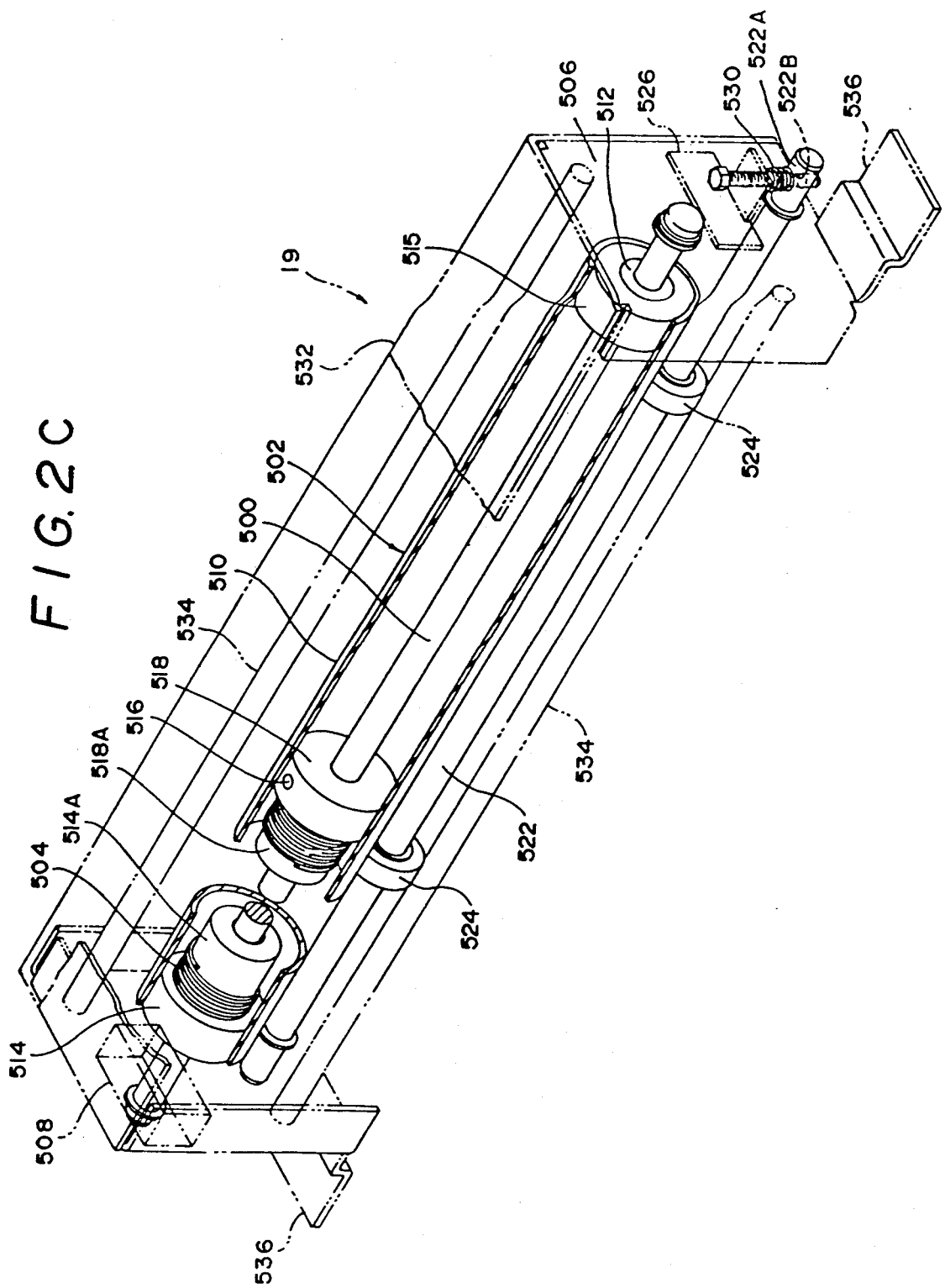

IMAGE TRANSFER APPARATUS AND METHOD

BACKGROUND OF THE INVENTION

1. Field of the Invention

The present invention relates to an image transfer apparatus and method for placing an image sheet and an image-receiving sheet one above the other to transfer an image on the image sheet to the image-receiving sheet.

2. Description of the Related Art

When a number of sheets are printed by fabricating printing plates formed of plate making material, such as PS plates, from a color original, a color proof is first prepared for a color proof operation.

Known photosensitive materials include those used in a silver-salt photographic process or electro-photographic process, as well as photopolymers. A color proof is produced by exposing an image to a photosensitive material for printing, then developing the printed image, and finally transferring the developed image to an image-receiving sheet.

Four types of photosensitive materials are employed to prepare image sheets having respective color images of black, cyan, magenta and yellow. Then, these images are successively transferred to the same image-receiving sheet so as to produce a multi-color image.

A transfer apparatus for successively transferring images from four image sheets to an image receiving sheet has been proposed in Japanese Patent Application No. 1-193632. With such an apparatus, each of the image sheets and the image-receiving sheet are placed on a guide plate in proper alignment. Subsequently, the image sheet and the image-receiving sheet are transported in one direction, passed through a transfer station of the transfer apparatus, and then transported in an opposite direction so as to be passed through the transfer station, again thereby allowing the image on the image sheet to be transferred to the image-receiving sheet.

With the above-described transfer apparatus, an operator must manually conduct the operations of covering the guide plate with the image sheet and the image-receiving sheet placed thereon with a cover sheet before transfer, and exfoliating the cover sheet after transfer. That is, leading ends of the cover sheet and the guide plate are secured to each other, and the operator pulls the cover sheet from its trailing-end side over to the transfer station. In this state, after the image sheet and the image-receiving sheet are positioned on the guide plate, the cover sheet is brought down from over the transfer station to cover them. In addition, after transfer, the operator exfoliates the cover sheet and pulls it to over the transfer station. In this state the image sheet is removed from a support plate, and an ensuing image sheet is positioned on the image-receiving sheet placed on the guide plate.

Thus, since the operation of covering the image sheet and the image-receiving sheet with the cover sheet and the operation of exfoliating the cover sheet are manually conducted, the cover sheet is liable to be damaged and stained, and the operation becomes complicated. In addition, since the positioning of the image sheet and the image-receiving sheet is effected with the cover sheet tucked up over the transfer station, the cover sheet can slip off the transfer station during the positioning operation, thereby hampering the positioning operation.

In addition, while a transporting sheet assembly is being transported in the opposite direction, the cover sheet can curl up and wrapped around a roller of the transfer station, thereby causing damage to the cover sheet to be damaged such as by.

SUMMARY OF THE INVENTION

In view of the foregoing, it is an object of the present invention to provide an image transfer apparatus and method which do not require the above-described complicated operation and are capable of avoiding damage to a cover sheet.

To this end, in accordance with one aspect of the present invention, there is provided an image transfer apparatus for transferring an image recorded on an image sheet to an image-receiving sheet, having a: transporting means for transporting a guide plate, on which the image sheet and the image-receiving sheet, superposed one above the other is placed, along a transporting passage in a first direction, and for transporting the same along the transporting passage in a second direction opposite to the first direction. A transfer station is disposed in an intermediate portion of the transporting passage and adapted to transfer the image recorded on the image sheet to the image-receiving sheet as the guide plate transported in the first direction and in the second direction passes therethrough. A takeup device having a cover sheet which is disposed on an inserting side, as viewed in the first direction, of the transfer station is provided in the vicinity of the transporting passage and is adapted to be drawn out with the transport of the guide plate as the guide plate is transported in the first direction so as to cover the image sheet and the image-receiving sheet on the guide plate. The takeup device is adapted to be taken up with the transport of the guide plate as the guide plate is transported in the second direction so as to expose the image sheet and the image-receiving sheet on the guide plate.

In accordance with another aspect of the present invention, there is provided an image transfer apparatus for transferring an image recorded on an image sheet to an image-receiving sheet wherein the image sheet and the image-receiving sheet placed one above the other on a guide plate, together with the guide plate and a cover sheet having one end secured to the guide plate for covering the image sheet and the image-receiving sheet, are transported from a side of the one end portion along a transporting passage and passed through a transfer station, and are subsequently transported from an opposite side to end portion along the transporting passage and are passed again through the transfer station. The image transfer apparatus includes a takeup device disposed at a predetermined position on a side of the transfer station which is the same side as the opposite end portion side, for supporting an opposite end portion of the cover sheet to the one end portion thereof. The takeup device is adapted to allow the cover sheet to be drawn out beginning with one end portion side thereof with the transport of the guide plate as the image sheet and the image-receiving sheet are transported from the one end portion side so as to cover the image sheet and the image-receiving sheet on the guide plate. Also, the takeup device is adapted to take up the cover sheet beginning with the opposite end portion thereof with the transport of the guide plate as the image sheet and the image-receiving sheet are transported from the opposite side.

Accordingly, the image sheet and the image-receiving sheet together with the guide plate and the cover sheet having one end secured to the guide plate for covering the image sheet and the image-receiving sheet, are transported from a side of one end portion along a transporting passage and passed through a transfer station. At that juncture, since one end of the cover sheet is secured to the guide plate, the cover sheet is drawn out from the takeup device as the guide is transported so as to cover the image sheet and the image-receiving sheet on the guide plate. Hence, the image sheet and the image-receiving sheet pass through the transfer station in a state in which they are covered with the cover sheet. Then, the image sheet and the image-receiving sheet covered with the cover sheet are transported in an opposite direction along the transporting passage and passed through the transfer station beginning with an end portion side of the sheets opposite to the one end portion side thereof, thereby completing the transfer of the image on the image sheet to the image-receiving sheet. At that juncture, since the opposite end portion of the cover sheet is supported by the takeup device, as the guide plate is transported in the opposite direction, the cover sheet is taken up by the takeup device beginning with the opposite end portion thereof. Thus, in accordance with the present invention, the cover sheet is drawn out from the takeup device only during transfer to cover the image sheet and the image-receiving sheet on the guide plate.

In accordance with still another aspect of the present invention, the takeup device of the above-described image transfer apparatus has a takeup roller for supporting the opposite end portion of the cover sheet, and driving means for rotating the takeup roller.

Accordingly, the takeup roller which supports the opposite end portion of the cover sheet is rotated by the driving means in the direction of taking up the cover sheet as the guide plate is transported toward the opposite side, so that the cover sheet is taken up onto the takeup roller beginning with the opposite end portion thereof.

In accordance with a further aspect of the present invention, the driving means of the above-described image transfer apparatus has an urging means for constantly urging the takeup roller in a direction of taking up the cover sheet.

Accordingly, the takeup roller is constantly urged by the urging means in the direction of taking up the cover sheet, and the cover sheet is drawn out against the urging force during transport of the guide plate toward the one end portion side, while the cover sheet is taken up onto the takeup roller by the urging force during transport of the guide plate toward the opposite side.

In accordance with a still further aspect of the present invention, the urging means of the above-described image transfer apparatus is a spring incorporated in the takeup roller and set in an urging state.

Accordingly, the urging means is a spring incorporated in the takeup roller, so that the takeup device is compact in size.

In accordance with a further aspect of the present invention, the driving means of the above-described present invention is a motor.

Accordingly, during transport of the guide plate toward the opposite side, the takeup roller is rotated by the motor to take up the cover sheet. In this case, a clutch may be provided between the takeup roller and the motor to disengage the takeup roller from the motor while the cover sheet is being drawn out so as to ensure that the drawing out of the cover sheet can be effected smoothly. Or, the drawing out and taking up of the cover sheet may be effected by forward or backward rotation of the motor.

As a method of the present method, there is provided an image transfer method for transferring an image recorded on an image sheet to an image-receiving sheet wherein the image sheet and the image-receiving sheet placed one above the other, on a guide plate, together with the guide plate and a cover sheet having one end secured to the guide plate for covering the image sheet and the image-receiving sheet, are transported from one end portion along a transporting passage and passed through a transfer station. The image sheet, image receiving sheet and the guide plate are subsequently transported from an opposite side back to the one end portion along the transporting passage and are passed again through the transfer station, the image transfer method has the steps of; drawing out, at a predetermined position on a side of the transfer station which is the same side as the opposite end portion side, the cover sheet beginning with one side thereof, while the guide plate, the image sheet and the image-receiving sheet are transported from the one side, so as to cover the image sheet and the image-receiving sheet; and taking up at the predetermined position the cover sheet beginning with the opposite end portion thereof while the guide plate, the image sheet and the image-receiving sheet are transported from the opposite side.

In accordance with the method of the present invention arranged as described above, the image sheet and the image-receiving sheet together with the guide plate and the cover sheet having one end secured to the guide plate for covering the image sheet and the image-receiving sheet, are transported from the one end portion side along a transporting passage and passed through a transfer station. At that juncture, the cover sheet is drawn out beginning with the one end portion side thereof as the guide is transported from the one end portion side so as to cover the image sheet and the image-receiving sheet on the guide plate. Hence, the image sheet and the image-receiving sheet pass through the transfer station by being covered with the cover sheet. Then, the image sheet and the image-receiving sheet, covered with the cover sheet, are transported in an opposite direction along the transporting passage and passed through the transfer station beginning with an end portion of the sheets opposite to the one end portion side thereof, thereby completing the transfer of the image on the image sheet to the image-receiving sheet. As the guide plate is transported in the opposite direction, the cover sheet is taken up beginning with the opposite end portion thereof. Thus, in accordance with the present invention, the cover sheet is drawn out only during transfer to cover the image sheet and the image-receiving sheet on the guide plate.

As described above, in accordance with the present invention, the arrangement is provided such that the cover sheet is drawn out during transfer so as to cover the image sheet and the image-receiving sheet, and is taken up upon completion of the transfer operation. Accordingly, to no complicated manual operations are required for covering the image sheet and the image-receiving sheet with the cover sheet and exfoliating the cover sheet. Also the possibility of damaging and staining the cover sheet due to the manual operation can be obviated, and the risk of damaging the cover sheet in the transfer station can be eliminated since the cover sheet is taken up with the transport of the guide plate.

The above and other objects, features and advantages of the invention will become more apparent from the following detailed description of the invention when read in conjunction with the accompanying drawings.

BRIEF DESCRIPTION OF THE DRAWINGS

FIGS. 1 to 11 illustrate a first embodiment of the present invention, in which

FIG. 1 is a side elevational view of an image transfer apparatus of the first preferred embodiment of the invention;

FIG. 2 is an exploded perspective view of the image transfer apparatus of FIG. 1;

FIG. 2A is a front vertical cross-sectional view of a takeup device;

FIG. 2C is an exploded perspective view of the takeup device;

FIG. 3 is an exploded perspective view of a positioning mechanism;

FIG. 4 is a side elevational view of the positioning mechanism;

FIG. 5 is an exploded perspective view of a first inserting mechanism;

FIG. 6 is an exploded perspective view of a structure for supporting tacking rollers and heating transfer rollers;

FIG. 7 is a cross-sectional view taken along line VII—VII in FIG. 6;

FIG. 8 is a cross-sectional view taken along line VIII—VIII in FIG. 6;

FIG. 9 is a perspective view of a second inserting mechanism;

FIG. 10 is a block diagram illustrating electrical connections between a control unit and other components;

FIG. 11 is a flowchart illustrating operation of the image transfer apparatus;

FIGS. 12 to 20 illustrate a second preferred embodiment, in which FIG. 12 is a side elevational view of an image transfer apparatus of the second embodiment;

FIG. 13 is an exploded perspective view of the image transfer apparatus;

FIG. 14 is a perspective view of a structure for supporting the tacking rollers;

FIG. 15 is a perspective view of a structure for supporting the heating transfer rollers;

FIG. 16 is a cross-sectional view of the heating transfer roller;

FIG. 17 is a cross-sectional view taken along line XVII—XVII in FIG. 16;

FIG. 18 is a plan view of a drive system for transporting a guide plate;

FIG. 19 is a block diagram illustrating electrical connections between the control unit and other components;

FIG. 20 is a flowchart illustrating operation of the image transfer apparatus;

FIGS. 21 to 27 illustrate a third preferred embodiment, in which

FIG. 21 is a side elevational view of an image transfer apparatus;

FIG. 22 is an exploded perspective view of the image transfer apparatus;

FIG. 23 is a perspective view illustrating a transfer station;

FIG. 24 is a cross-sectional view illustrating a structure for supporting the heating transfer rollers;

FIG. 25 is a cross-sectional view taken along line XXV—XXV in FIG. 24;

FIG. 26 is a block diagram illustrating electrical connections between a control unit and other components; and FIG. 27 is a flowchart illustrating operation of the image transfer apparatus.

DESCRIPTION OF THE PREFERRED EMBODIMENTS

Figure 1:
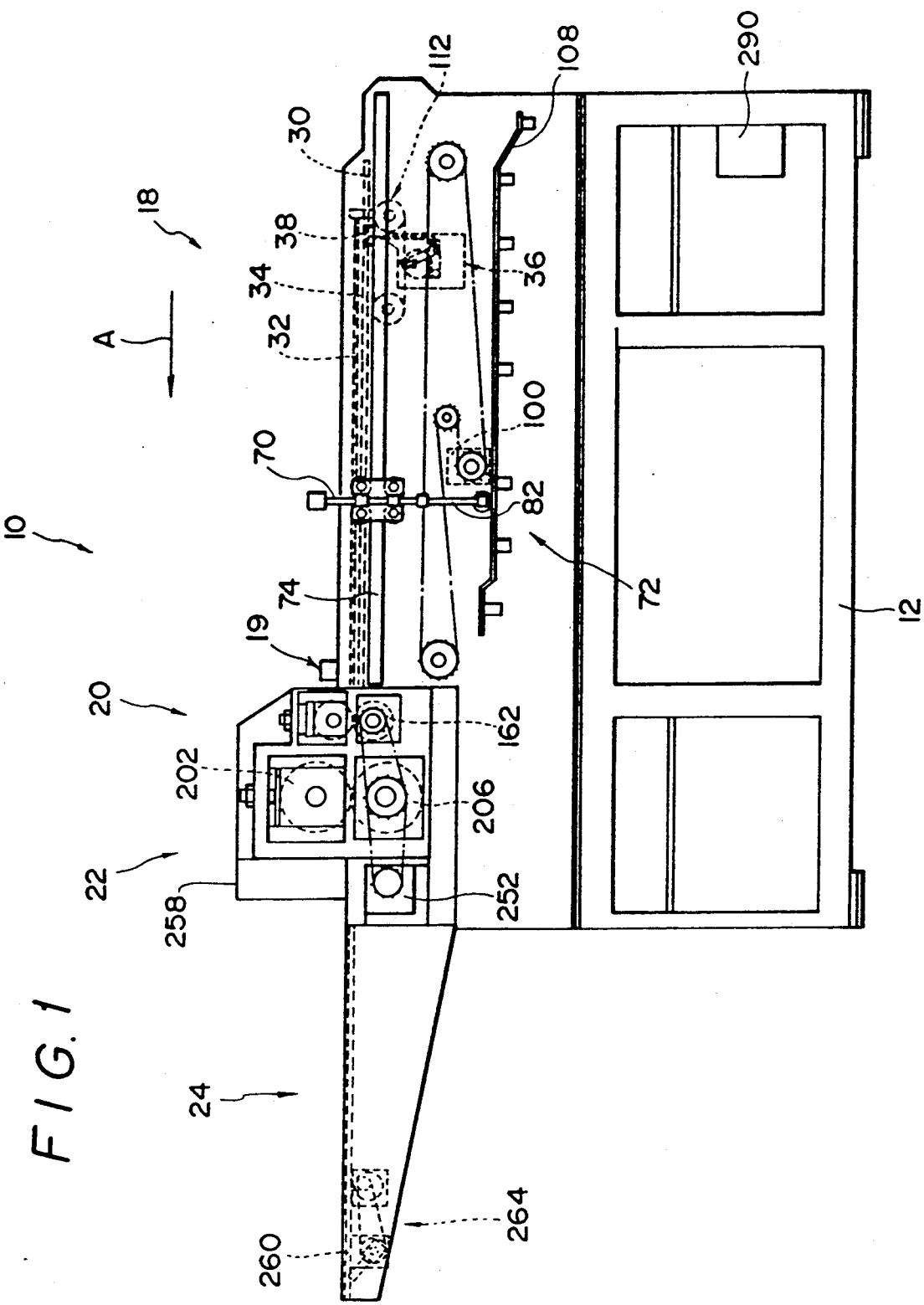

FIG. 1 illustrates a first embodiment of an image transfer apparatus 10 to which an image transfer method in accordance with the present invention is applied. Specifically, FIG. 1 is a left-hand side sectional view illustrating schematic construction of the image transfer apparatus, and FIG. 2 is an exploded perspective view of the image transfer apparatus.

Figure 2:
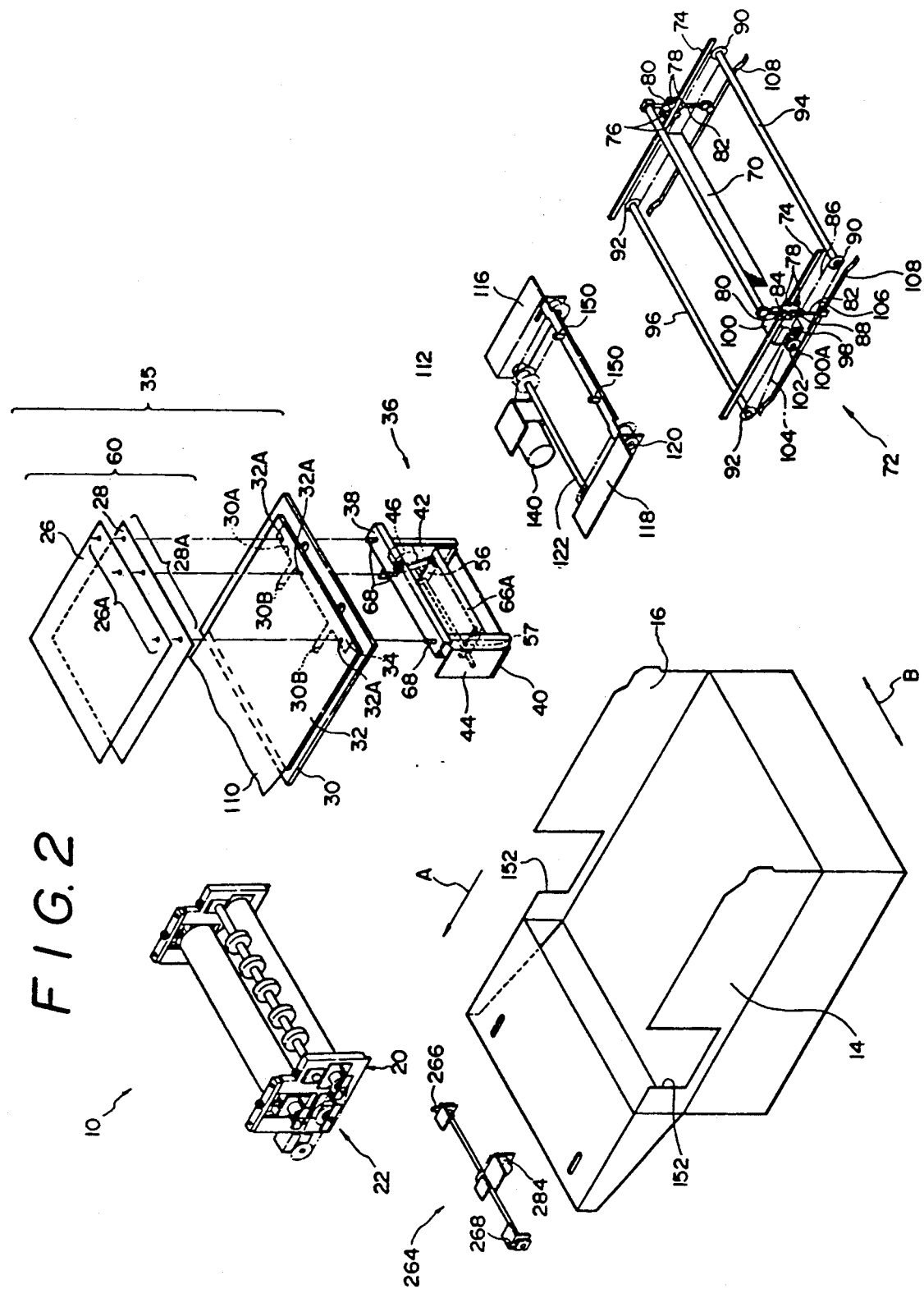

As shown in FIGS. 1 and 2, the image transfer apparatus 10 has a pair of side plates 14 and 16 vertically disposed on a machine base 12, and includes a working station 18, tacking station 20, transfer station 22 and receiving station 24 successively disposed in the lengthwise direction of the machine base 12. Also, the image transfer apparatus 10 has a takeup device 19 for rolling up a cover sheet 110 in such a manner as to be capable of rolling it back out, the cover sheet 110 being adapted to cover a transporting sheet pair 60 which will be described later. An image sheet 26 having an image printed thereon and an image-receiving sheet 28 are placed one above the other in the working station to constitute the transporting sheet pair 60. The transporting pair is then covered with the cover sheet 110 to constitute a transporting sheet assembly 35. The transporting sheet assembly 35 is transported through the tacking station 20, transfer station 22 and receiving station 24, and is then transported in an opposite direction to return to the working station 18, thereby completing transfer of the image on the image sheet 26 to the image-receiving sheet 28.

The working station 18 includes a working table 30 disposed between the side plates 14 and 16. The working table 30 is supported on both sides by the side plates 14 and 16, and has a guide plate 32 rested on the upper surface thereof. The image-receiving sheet 28 and the image sheet 26 are placed in this order on the guide plate 32 one above the other, i.e., in superposed relation.

A rectangular opening 34 is provided in the working table 30, on a trailing side thereof in the transporting direction, in such a manner as to extend along the widthwise direction of the image transfer apparatus 10 (in the direction of double-headed arrow B). A flat bar 38 adapted to move vertically by means of a positioning mechanism 36 is inserted in this opening 34.

Figure 3:
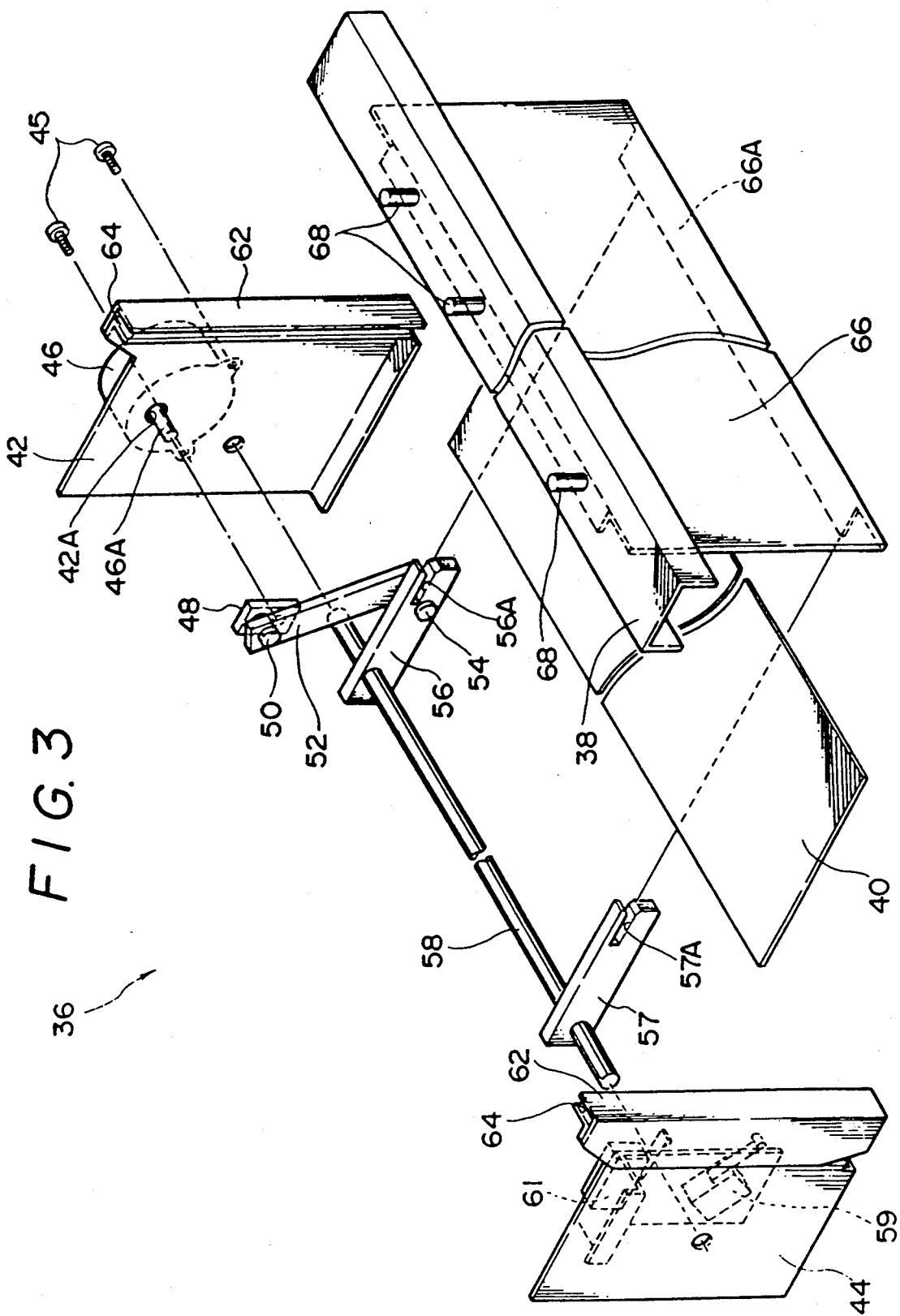
Figure 4:
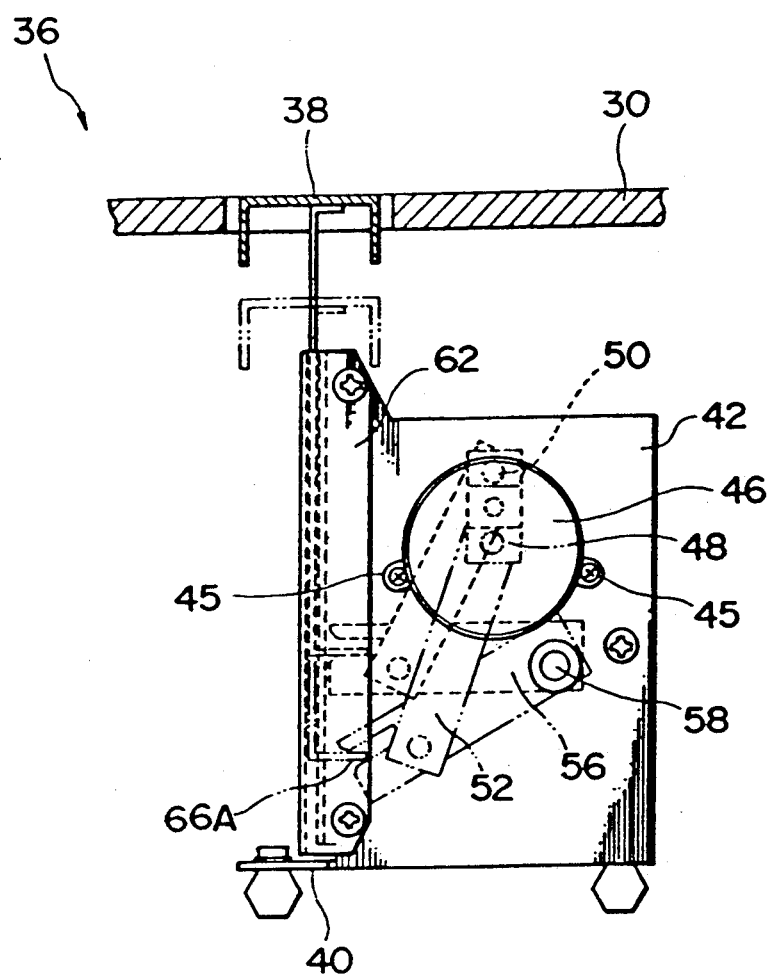

As shown in FIG. 2, the positioning mechanism 36 is disposed under the working table 30. As shown in FIG. 3, positioning mechanism 36 has a pair of side plates 42 and 44 disposed vertically on a base 40. One side of each of these side plates 42 and 44 is bent toward the other side plate and a slide portion 64 is formed between the same and a bracket 62 secured to each of the side plates 42 and 44. Inserted in this slide portion 64 is a slide plate 66 connected to a lower portion of the flat bar 38. The vertical movement of the slide plate 66 causes the flat bar 38 to move into or out of a rectangular through hole 30A provided in the working table 30.

A motor 46 is attached to an outer side of the side plate 42 by means of screws 45. A drive shaft 46A of the motor 46 extends through a through hole 42A provided in the side plate 42, projecting into the space between the side plates 42 and 44.

One end of an arm 48 is secured to a distal end of the drive shaft 46A. One end of a pin 50 is rotatably supported by the other end of the arm 48. One end of a connecting arm 52 is rotatably supported by the other end of the pin 50. One end of a pin 54 is rotatably supported by the other end of the connecting arm 52, while the other end of the pin 54 is rotatably supported by an intermediate portion of a driving arm 56. The other end of the driving arm 56 is rotatably supported by a support shaft 58 extending between and carried by the side plates 42 and 44. A slit 56A is formed in the other end portion of the driving arm 56. Inserted in this slit 56A is a lower bent portion 66A of the slide plate 66.

In addition, a driving arm 57 having the same configuration as the driving arm 56 is supported at its one end by an intermediate portion of the support shaft 58. A slit 57A is formed at the other end of this drive arm 57, and the lower bent portion 66A is inserted therein.

Accordingly, as the drive shaft 46A rotates, the arm 48 in turn rotates, causing the connecting arm 52 to swing. As the connecting arm 52 swings, the driving arms 56 and 57 rotate about the support shaft 58, causing the slide plate 66 to move vertically. In addition, a plurality of positioning pins 68 are disposed vertically on the flat bar 38. Intervals of these positioning pins 68 are set in correspondence with those of rectangular through holes 32A formed in the guide plate 32 for positioning on the working table 30 the transporting sheet pair 60 with the image sheet 26 placed on the image-receiving sheet 28 one above the other.

The positioning pins 68 are arranged corresponding to positioning holes 26A and 28A bored through the image sheet 26 and the image-receiving sheet 28, respectively, for aligning (registering) the image sheet 26 and the image-receiving sheet 28 with each other see FIG. 2.

In addition, limit switches 59 and 61 are fixed to the slide plate 44. These limit switches 59 and 61 abut against the driving arm 57 for setting the raising position and lowering position of the flat bar 38.

As illustrated in FIG. 2, above the working station 18, there is disposed a brush 70 extending along the widthwise direction (indicated by arrow B) of the working table 30. The brush 70 can be moved by a brush drive mechanism 72 in the direction of travel (indicated by arrow A) of the transporting sheet pair 60.

As shown in FIG. 2, the brush drive mechanism 72 has a pair of guide rails 74 positioned on the outside of and attached to the side plate 14 and 16, respectively. On either side, a pair of guide rollers 76 and a pair of guide rollers 78 are disposed to hold one of guide rails 74 therebetween from above and beneath. These two pairs of guide rollers 76 and guide rollers 78 are fixed to a movable plate 80, whereby the movable plate 80 is guided in the lengthwise direction (indicated by arrow A) of the guide rail 74.

A thrust shaft 82 vertically disposed has its intermediate portion coupled to each movable plate 80 through slide bearings 84. This allows the thrust shaft 82 to move in the direction of travel of the transporting sheet pair 60, as well as to move vertically.

The thrust shaft 82 is coupled through a connecting bracket 88 to a chain belt 86 disposed to extend in the direction of travel of the transporting sheet pair 60. This coupling is made such that the thrust shaft 82 can move vertically with respect to the connecting bracket 88.

The chain belt 86 is stretched between and around a pair of sprockets 90 and 92. The pair of sprockets 90 and 92 are fixed on either side to one ends of a pair of shafts 94 and 96 extending between and carried by the side plates 14 and 16. The sprockets 92 and 94 are arranged outside the side plates 14 and 16.

A sprocket 98 is pivotally supported by the side plate 14 between the sprockets 92 and 94. Furthermore, a motor 100 is supported by the side plate 14 between the sprocket 98 and the sprocket 92 via an unillustrated attachment bracket. A drive shaft 100A of the motor 100 projects outwardly of the side plate 14. A sprocket 102 is secured to a distal end of the drive shaft 100A projecting outwardly of the side plate 14. A chain belt 104 is provided on the sprockets 90, 92, 98, and 102. This arrangement permits the chain belt 104 to be driven by the torque of the motor 100.

A pair of guide rollers 106 is attached to respective lower ends of the pair of thrust shafts 82, and rested on the upper surfaces of a pair of guide plates 108. The guide plates 108 are arranged to extend in the lengthwise direction of the side plates 14 and 16 and fixed in place outside the side plates 14 and 16. The guide plates 108 are each bent into the stepped form on the side from which the transporting sheet pair 60 is to be inserted, such that the guide plate 108 has its distal end located below an intermediate portion thereof. The guide plates 108 are each also bent into the stepped form in its rear end, i.e., on the side near the tacking station 20, such that the rear end is located above the intermediate portion of the guide plate 108. Therefore, the brush 70 is located below the intermediate portions of the guide plates 108 to facilitate the inserting operation by an operator, while the distal end of the brush 70 is located above the transporting sheet pair 60 on the side near the tacking station 20.

The transporting sheet assembly 35 is formed by covering the transporting sheet pair 60 placed on the guide plate 32 with the cover sheet 110.

As shown in FIG. 2, one end of the cover sheet 110 is fixed to the guide plate 32 on the side near the tacking station 20, and the other end of the cover sheet 110 is retained by the takeup device 19. This cover sheet 110 covers the upper surface of the transporting sheet pair 60 to protect the transporting sheet pair 60.

As shown in FIG. 1, the takeup device 19 is disposed on the side of the working station 18 adjacent to the tacking station 20.

Figure 2B:
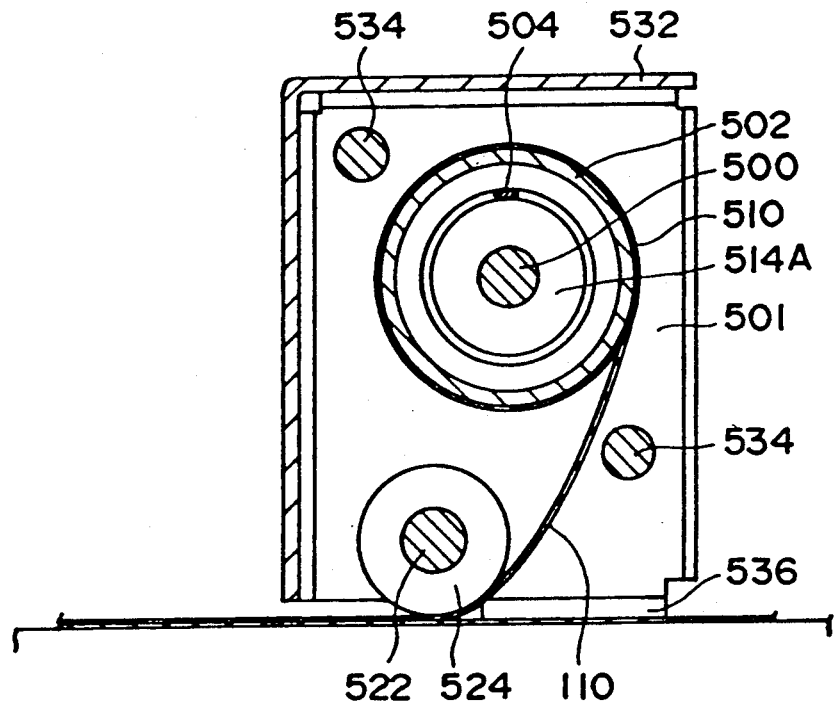
FIG. 2B is a cross-sectional view taken along line IIB—IIB in FIG. 2A.

As shown in FIGS. 2A to 2C, main components of this takeup device 19 include a shaft 500, a takeup roller 502 rotatably supported by the shaft 500, and a spring 504 disposed between the shaft 500 and the takeup roller 502.

The shaft 500 is supported at opposite ends by a pair of substantially rectangular side plates 501 and 506, and is prevented from rotating relative to the side plate 501 by means of a rotation-preventing block 508 secured to the outer surface of the side plate 501.

The takeup roller 502 includes a casing 510 onto an outer peripheral surface of which the cover sheet 110 is taken up, as well as caps 514 and 515 having bearings 512 secured to opposite ends of the casing 510 and adapted to close openings at the opposite ends thereof.

A boss 514A projecting inwardly of the casing 510 is formed on the cap 514. Meanwhile, a spring receiving member 518 whose rotation relative to the shaft 500 is prevented by means of a pin 516 is retained by a longitudinally intermediate portion of the shaft 500. A boss 518A projecting in the direction of facing the boss 514A is formed on the spring receiving member 518.

The spring 504 has its opposite end portions fitted over the boss 514A and the boss 518A and retained by the cap 514 and the spring receiving member 518. Accordingly, after the takeup roller 502 is rotated relative to the shaft 500 against the urging force of the spring 504, if the urging force accumulated in the takeup roller 502 is released, the takeup roller 502 is rotated in an opposite direction to the aforementioned rotating direction by means of the urging force of the spring 504. That is, in a state in which the takeup roller 502 has been rotated and the urging force of the spring 504 has been accumulated, if the urging force accumulated in the takeup roller 502 is released after the cover sheet 110 is retained by the outer periphery of the casing 510 of the takeup roller 502, the cover sheet 110 is taken up onto the takeup roller 502 by virtue of the urging force of the spring 504. The cover sheet 110 thus taken up can be rolled out from the takeup roller 502 against the urging force of the spring 504.

In addition, the takeup device 19 has a guide portion 520 for guiding the cover sheet 110 smoothly when the cover sheet 110 is taken up onto or rolled out from the takeup roller 502.

The guide portion 520 has a shaft 522 supported by the side plates 501 and 506 and two guide rollers 524 pivotally supported by the shaft 522. The shaft 522 has its opposite ends, i.e., extending portions 522A, penetrating the side plates 501 and 506 and extending outwardly thereof. A through hole 522B is formed in each of the extending portions 522A. A bracket 526 having a substantially L-shaped section is secured to an outer surface of each of the side plates 501 and 506 in correspondence with the extending portion 522A. A distal end portion of a screw 528 threadingly engaged with the bracket 526 is penetrated through the through hole 522B of the extending portion 522A, whereby the shaft 522 is prevented from rotating relative to the side plates 506 and 501. A coil spring 530 through which the screw 528 is inserted is provided between the bracket 526 and the extending portion 522A, so that the shaft 522 is prevented from moving with play by being pressed by this coil spring 530.

Accordingly, at the time when the cover sheet 110 is taken up onto or paid out from the takeup roller 502, the cover sheet 110 moves smoothly while the surface of the cover sheet 110 is being guided by the guide rollers 524.

Furthermore, the takeup device 19 has a cover 532 fixed to the side plates 501 and 506 and for covering the tacking station 20 side and upper side of the takeup roller 502, the guide rollers 524, and so on, the cover 532 having a substantially L-shaped section. The takeup roller 502, the guide rollers 524, and so on are protected by this cover 532. In addition, a shaft member 534 for fixing the width extends between, and is carried by the side plates 501 and 506. Even if the side plates 501 and 506 are pressed in the axial direction of the shaft 500, the side plates 501 and 506 are prevented from bending in that direction by means of this shaft member 534.

The takeup device 19 thus arranged is mounted on the side plates 14 and 16 in the vicinity of the tacking station 20 via attachment brackets 536. After mounting, in a state in which the takeup roller 502 is rotated about the shaft 500 against the urging force of the spring 504 to accumulate the urging force, i.e., after the takeup roller 502 is manually rotated and held by the operator and while this state is being maintained, an end portion of the cover sheet 110 opposite to the fixed end thereof is attached to the outer periphery of the casing 510 of the takeup roller 502 by using an attaching member such as double coated adhesive tape or the like. After this attaching operation is completed, if the operator releases the urging force accumulated in the takeup roller 502, the cover sheet 110, beginning with the end portion thereof opposite to the fixed end, is taken up onto the takeup roller 502 by means of the urging force of the spring 504.

It should be noted that, for instance, a tensile coil spring can be used as the spring 504.

Figure 5:
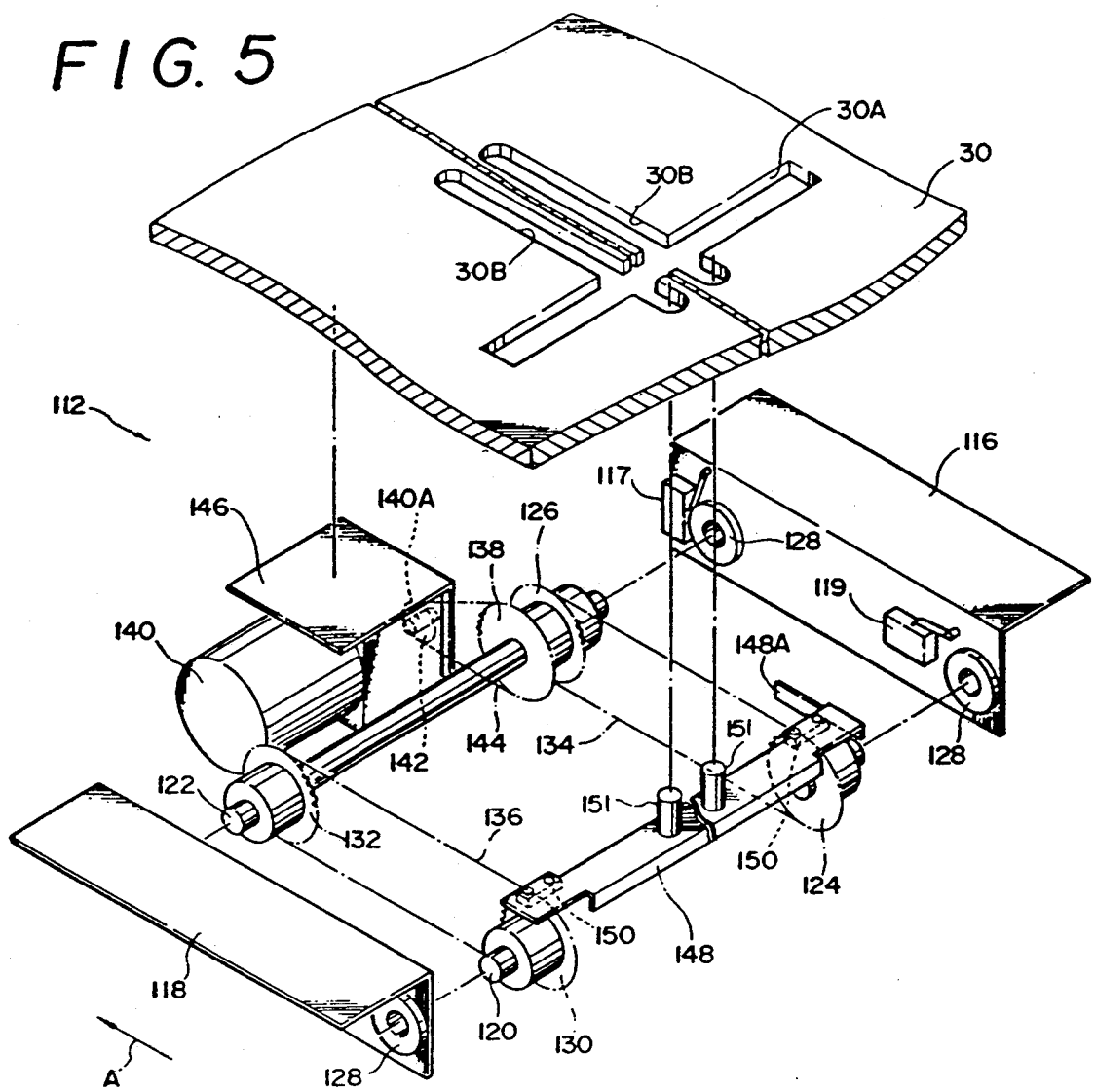

A first inserting mechanism 112, i.e., a first inserting means, is disposed on the underside of the working table 30 of the working station 18 on the side where the transporting sheet pair 60 enters. As shown in FIG. 5, a pair of side plates 116 and 118 each having an L-shaped section are fixed to the underside of the working table 30 in such a manner as to face each other. Two support shafts 120 and 122 extend between and are carried by the side plates 116 and 118 via bearings 128.

Sprockets 124 and 126 are respectively secured to ends of the support shafts 120 and 122 on the side of the side plate 116. In addition, sprockets 130 and 132 are respectively secured to the opposite ends of the support shafts 120 and 122 on the side of the side plate 118. An endless chain belt 134 is stretched between and wound around the sprockets 124 and 126. An endless chain belt 136 is stretched between and wound around the sprockets 130 and 132.

A sprocket 138 is secured to the support shaft 122 on the side of the sprocket 126. An endless chain belt 144 is stretched between and wound around the sprocket 138 and a sprocket 142 secured to a drive shaft 140A of a motor 140. The motor 140 is fixed to the underside of the working table 30 via an L-shaped bracket 146. Accordingly, the endless chain belts 134 and 136 are driven by the torque of the motor 140.

An insertion plate 148 is fixed to the endless chain belts 134 and 136 via brackets 150. Insertion pins 151 are disposed vertically on the upper surface of the insertion plate 148. Distal ends of these insertion pins 151 respectively extend through a movement hole 30A provided vertically in the working table 30, and project from the upper surface of the working table 30. These projecting distal ends serve to abut against a side of the transporting sheet pair 60.

This first inserting mechanism 112 is adapted to insert the guide plate 32 into the tacking station 20 as the insertion pins 151 move in the direction of arrow A in FIG. 5.

In addition, the side plate 116 is provided with limit switches 117 and 119. These limit switches 117 and 119 are contacted by a contact portion 148A provided on one end of the insertion plate 148 in a projecting manner so as to set the moving position of the insertion plate 148.

At the working station 18, the guide plate 32 with the image sheet 26 and the image-receiving sheet 28 superposed thereon (this assembly being hereinafter referred to as the transporting sheet assembly 35) is sent from the working table 30 toward the tacking station 20. In this case, the transporting sheet pair 60 is sent to the tacking station 20 while being covered with the cover sheet 110 fixed to the guide plate 32 after being drawn out from the takeup device 19.

Figure 6:
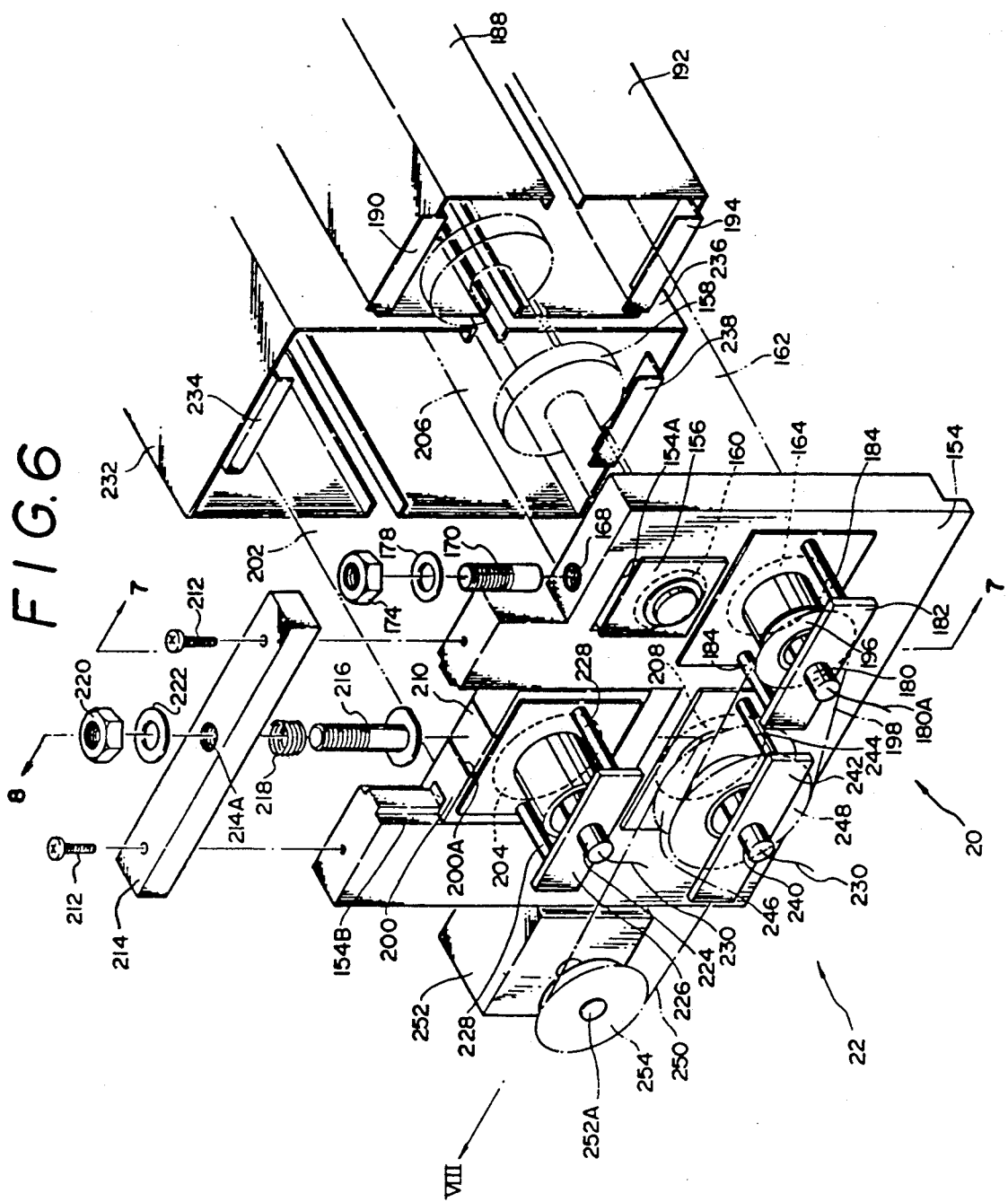

As shown in FIG. 2, openings 152 are formed in portions of the side plates 14 and 16 corresponding to the tacking station 20 and the transfer station 22 adjacent to the tacking station 20. As shown in FIG. 6, a pair of housing plates 154 are respectively fitted in those openings 152. A rectangular opening 154A is formed in an upper portion of the housing plate 154 corresponding to the tacking station 20. A housing 156 is inserted in this rectangular opening 154A. In the housing 156, a skewer type tacking roller 158 extends between the housing plates 154 and supported thereto via bearings 160. In addition, a roller 162 disposed in abutting relation with the tacking roller 158 and adapted to support the same is supported by a bearing 164. The transporting sheet assembly 35 is inserted into a nip between the tacking roller 158 and the roller 162, and is tacked by the skewer-type roller 158.

Figure 7:
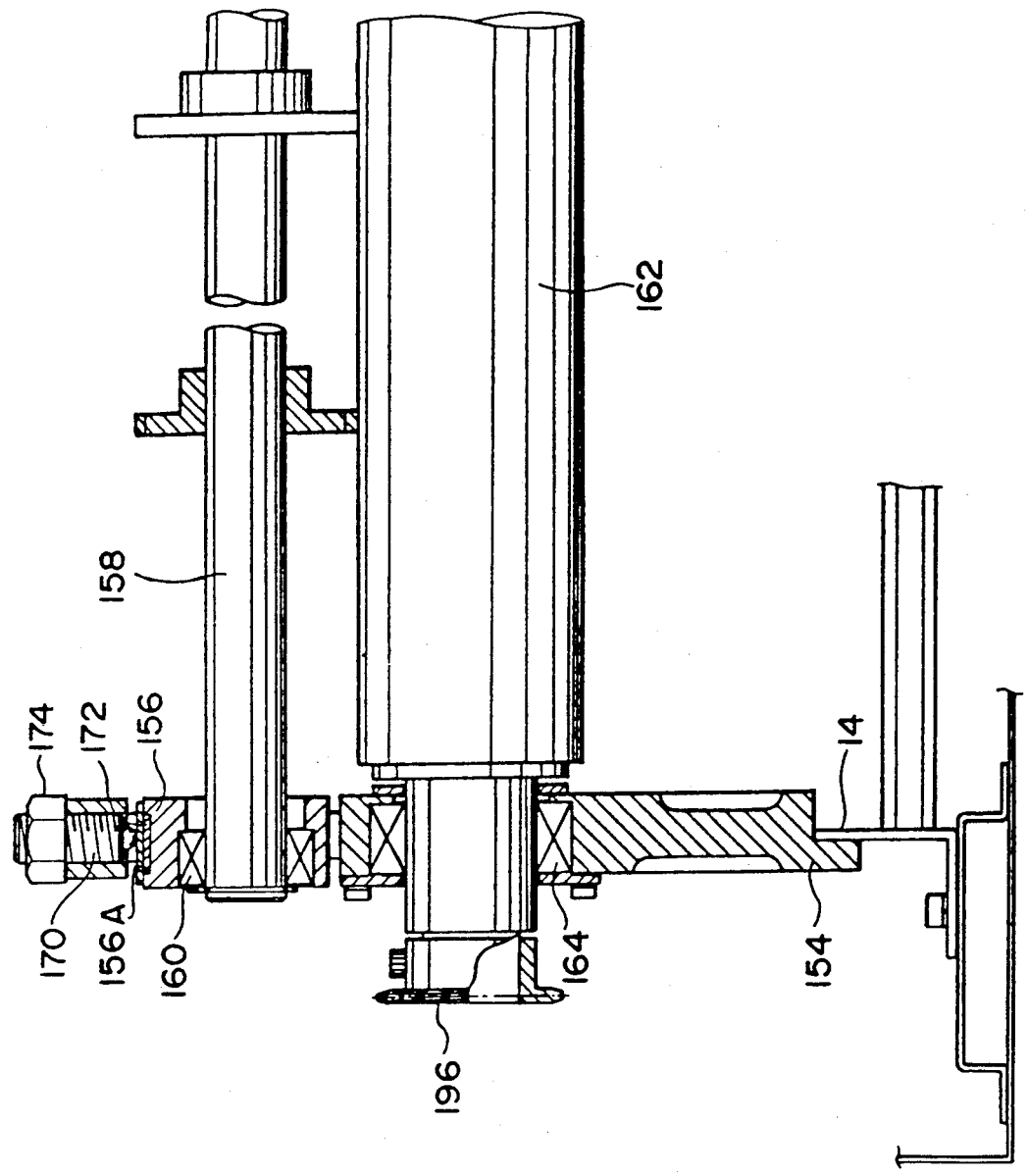
Figure 8:
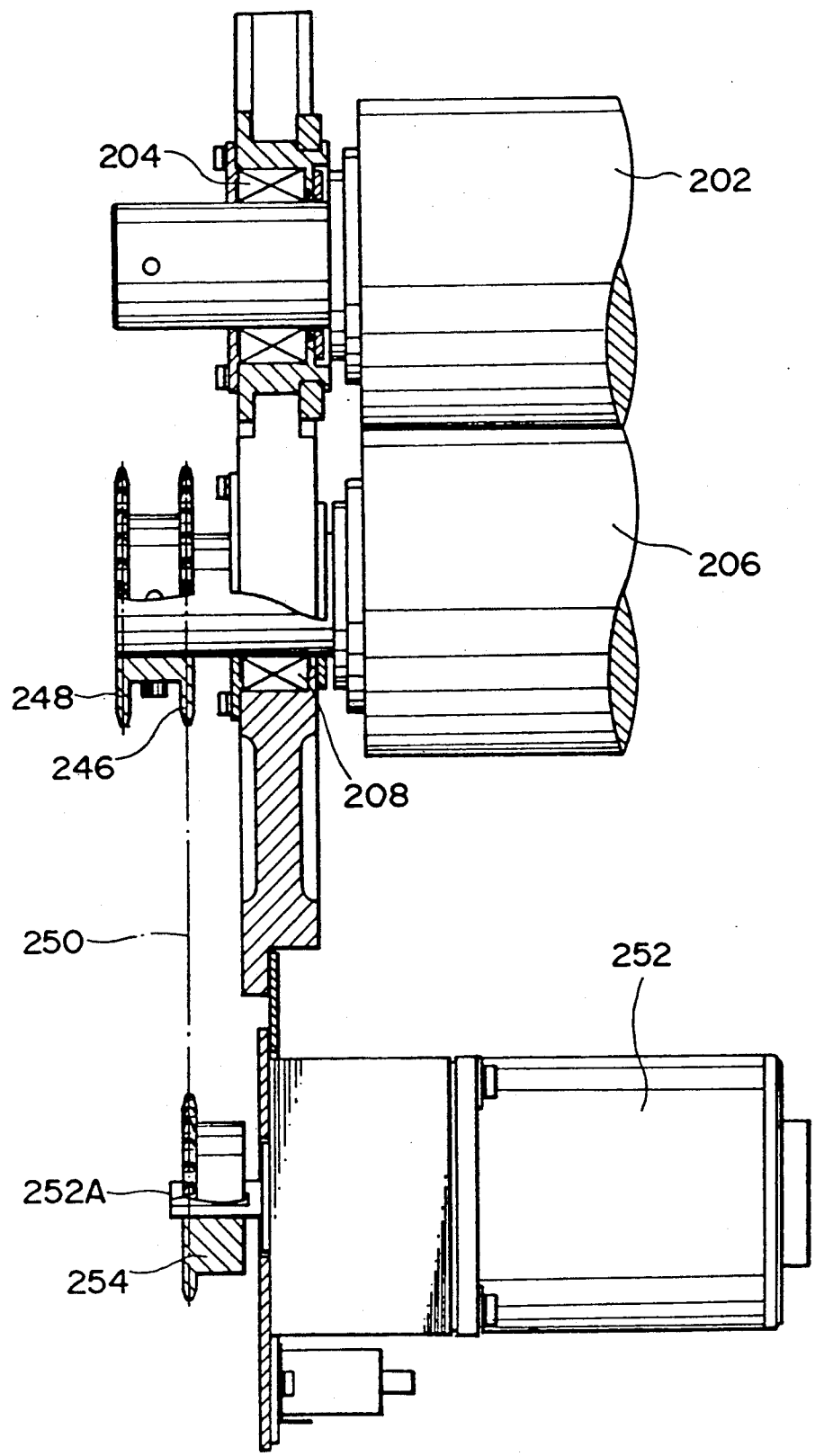

The widthwise dimension of the housing 156 to which the tacking roller 158 is supported is identical with the widthwise dimension of the rectangular opening 154A, and the longitudinal length thereof is set to be shorter than the depthwise length of the rectangular opening 154A. For this reason, the housing 156 is movable vertically within the opening 154A. Formed in an upper end portion of the housing 156 is a rectangular opening 156A, into which a stopper plate 172 is inserted to restrict the rotation of the stopper plate 172 (see FIG. 7).

In addition, a through hole 168 is formed in an upper wall portion above the rectangular opening 154A, and a spring plunger (or ball plunger) 170 is threadingly engaged with the through hole 168. A distal end of the spring plunger 170 extending through the through hole 168 and projecting into the rectangular opening 154A abuts against an upper portion of the housing 156. As the spring plunger 170 is tightened, the housing 156 is urged downwardly. The position of a lower portion of the housing 156 in the rectangular opening 154A is set as the tacking roller 158 is placed on the roller 162.

In addition, a thread is formed on the head of the spring plunger 170 projecting from above the housing plate 154, and a nut 174 is threadingly engaged therewith. A washer 178 is interposed between the nut 174 so as to prevent of looseness and the housing plate 154.

Accordingly, as the nut 174 is tightened, the housing 156 moves downwardly, causing the tacking roller 158 to approach the roller 162. At an initial stage the tacking roller 158 is maintained in condition, having no external forces thereon, i.e., the roller 162 is pressurized by only the weight of the tacking roller 158. In this condition, when the transporting sheet assembly 35, covered with the cover sheet 110 which has been drawn out from the takeup device 19, is inserted between the tacking roller 158 and the roller 162, the transporting sheet assembly 35 is pressed from the upper and lower directions by the taking roller 158 and the roller 162.

The roller 162 has a hollow configuration, and a bar heater 180 is inserted therein. The opposite ends of the bar heater 180 project from the opposite ends of the roller 162, and are supported to a support plate 182. The support plate 182 is fixed to the housing plate 154 via stays 184. Connected to a terminal of the bar heater 180 is one end of a lead wire 180A in turn connected to an unillustrated power supply. As the bar heater 180 is energized, the roller 162 is heated, and the tacking roller 158 is heated.

In addition, an axially upper portion of the tacking roller 158 is covered with a cover 188. This cover 188 is secured to the housing 156 via a substantially L-shaped attachment bracket 190. The cover 188 has a substantially U-shaped section the lower side of which is open, and a part of the outer periphery of the tacking roller 158 accommodated therein projects out of the opening and abuts against the roller 162 disposed below the tacking roller 158.

The roller 162 is covered with a cover 192 having the same configuration as the cover 188. The cover 192 is arranged such that a part of the outer periphery of the roller 162 projects outwardly through its opening which is open upwardly, and abuts against the tacking roller 158. The cover 192 is fixed to the housing plate 154 via a bracket 194 having a substantially L-shaped section. The covers 188 and 192 serve to prevent drops in the temperature of the tacking roller 158 and the roller 162.

Between the housing plate 154 and the support plate 182, a sprocket 196 is secured to a distal end of the roller 162. A chain belt 198 is wound around the sprocket 196. The sprocket 196 is arranged such that the torque of a motor 252 transmitted to a heating transfer roller (to be described later) is transmitted by the chain belt 198 to rotate the roller 162 forwardly or backwardly.

A rectangular opening 154B is formed in an upper portion of each of the housing plates 154 at a position corresponding to the transfer station 22. A housing 200 is inserted in the rectangular opening 154B. In the housing 200, a heating transfer roller 202 interposed between the housing plates 154 is supported by a bearing 204. In addition, a heating transfer roller 206, which is supported to the housing plate 154 and abuts against the heating transfer roller 202 to support the same, is supported by a bearing 208 in a lower portion of the heating transfer roller 202. The transporting sheet assembly 35 is inserted into a nip between the heating transfer rollers 202 and 206, where the transporting sheet assembly 35 is pressurized and heated so that the image recorded on the image sheet 26 is transferred to the image-receiving sheet 28.

The widthwise dimension of the housing 200 for supporting the heating transfer roller 202 is identical with the widthwise dimension of the rectangular opening 154B, and its longitudinal length is set to be shorter than the depthwise length of the rectangular opening 154B. Accordingly, the housing 200 is movable vertically inside the opening 154B. Formed in an upper end portion of the housing 200 is a rectangular opening 200A, into which a stopper plate 210 inserted to restrict the rotation of the stopper plate 210.

An upper portion of the rectangular opening 154B is closed by a plate 214 fixed to an upper surface of the housing plate 154 by means of bolts 212. The plate 214 is provided with a through hole 214A at an intermediate portion thereof, and a spring plunger 216 is inserted therethrough. A distal end of the spring plunger 216 extending through the through hole 214A and projecting into the rectangular opening 154B abuts against an upper face of the stopper plate 210. A compression coil spring 218 is interposed between the stopper plate 210 for the spring plunger 216 and the plate 214, and urges the housing 200 downwardly. The position of the lower portion of the housing 200 within the rectangular opening 154B is set as the heating transfer roller 202 is placed on the heating transfer roller 206.

A threaded portion is formed at a head of the spring plunger 216 projecting above the plate 214, and a nut 220 is threadingly engaged therewith. In addition, a washer 222 is interposed between the nut 220 and the plate 214.

Accordingly, as the nut 220 is tightened against the urging force of the compression coil spring 218, a pushing plate 200A moves upwardly, so that the heating transfer roller 202 readily escape upwardly when the transporting sheet assembly 35 passes between the heating transfer rollers 202 and 206, and the pressurizing force acting on the transporting sheet assembly 35 by the heating transfer rollers 202 and 206 becomes weak. On the other hand, as the nut 220 is loosened, the pushing plate 200A moves downwardly, so that the upward escape amount of the heating transfer roller 202 occurring when the transporting sheet assembly 35 passes between the heating transfer rollers 202 and 206 is reduced, and the pressurizing force acting on the transporting sheet assembly 35 by the heating transfer roller 202 and the heating transfer roller 206 becomes greater.

The heating transfer roller 202 has a hollow interior, a bar heater 224 being inserted therein. The opposite ends of the bar heater 224 project from the opposite ends of the heating transfer roller 202, and are supported by a support plate 226. Connected to a terminal of the bar heater 224 is one end of a lead wire 230 in turn connected to an unillustrated power supply. Hence, the bar heater is energized and heated.

In addition, the heating transfer roller 206 has the same hollow interior as the heating transfer roller 202, a bar heater 240 being inserted therein. The opposite ends of the bar heater 240 project from the opposite ends of the heating transfer roller 206, and are supported by support plates 242, respectively. The support plate 242 is secured to the housing plate 154 via stays 244.

An axially upward portion of the heating transfer roller 202 is covered with a cover 232. This cover 232 is fixed to the housing 200 via a substantially L-shaped bracket 234. The cover 234 has a substantially U-shaped section the lower side of which is open, and a part of the outer periphery of the heating transfer roller 202 accommodated therein projects outwardly from the opening and abuts against the heating transfer roller 206 disposed below the heating transfer roller 202.

In addition, the heating transfer roller 206 is covered with a cover 236 having the same configuration as the cover 188. The cover 236 is arranged such that a part of the outer periphery of the heating transfer roller 206 projects from the opening which is open upwardly and abuts against the heating transfer roller 202. The cover 236 is fixed to the housing plate 154 via a bracket 238 having a substantially L-shaped section. The covers 232 and 236 serve to prevent drops in the temperature of the heating transfer rollers 202 and 206.

Between the housing plate 154 and the plate 224, sprockets 246 and 248 are secured to a distal end of the heating transfer roller 206. A chain belt 250 is stretched between and wound around the sprocket 246 and a sprocket 254 secured to a drive shaft 252A of the motor 252. The motor 252 is fixed to the side plate 14 via a bracket 256.

Accordingly, the torque of the motor 252 is transmitted via the chain belt 250 and rotates the heating transfer roller 206 forwardly or backwardly. When forward rotation is effected, the transporting sheet assembly 35 is transported from the working station 18 to the receiving station 24. On the other hand, in the case of backward rotation, the transporting sheet assembly 35 is transported from the receiving station to the tacking station 20 and the working station 18.

A chain belt 198 wound around the sprocket 196 fixed to the roller 162 is wound around the sprocket 248. As a result, the torque of the motor 252 is transmitted to the roller 162 so that the roller 162 rotates.

The heating transfer rollers 202 and 206 are provided with a cover 258 via an unillustrated bracket so as to be shielded from the outside. This prevents heat of the heating transfer rollers 202 and 206 from being dissipated.

Figure 9:
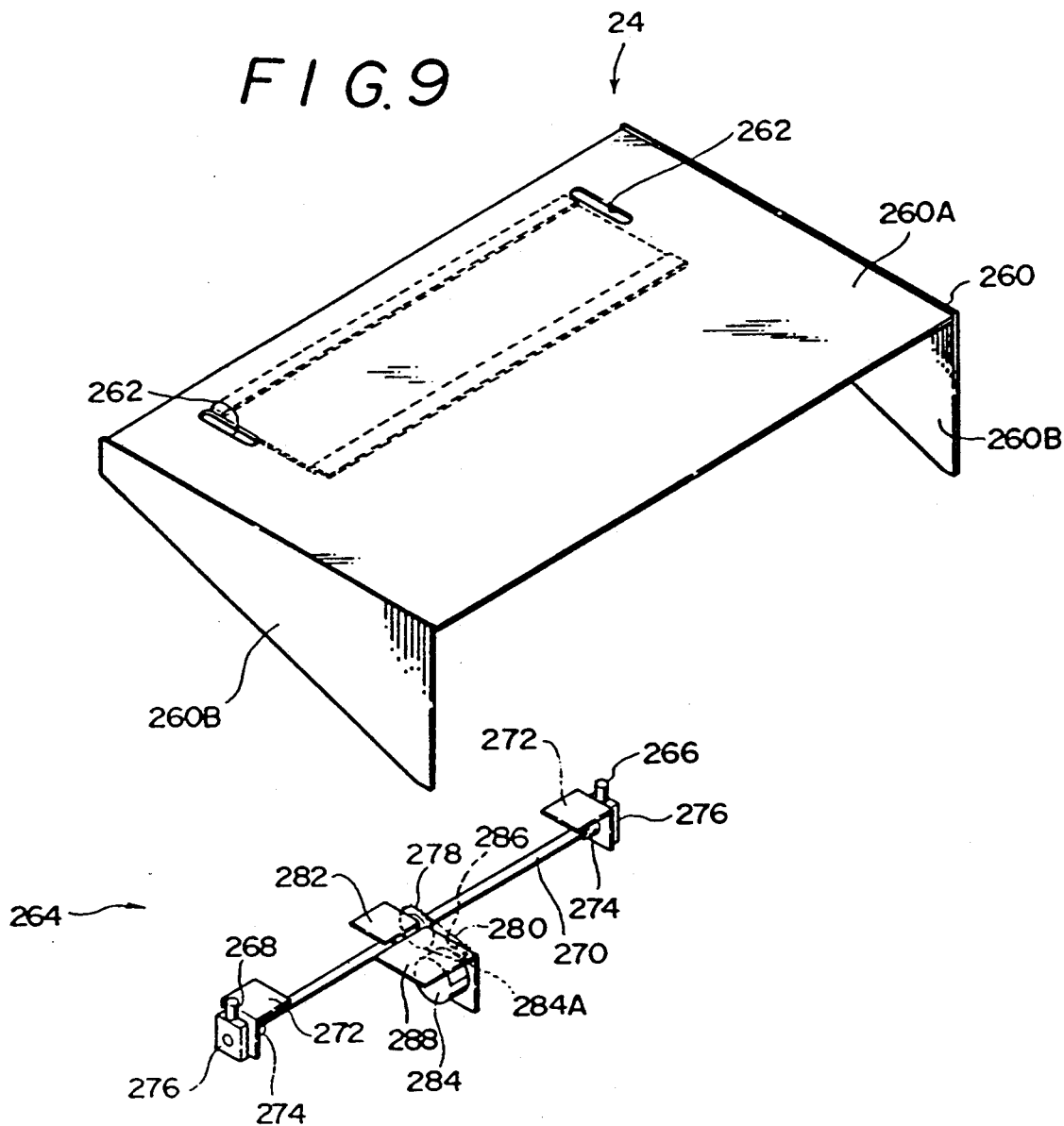

A receiving table 260 is disposed on the receiving station 24. As shown in FIG. 9, this receiving table 260 is arranged such that opposite sides of a flat portion 260A are bent substantially orthogonally to serve as attaching portions 260B for the side plates 14 and 16. A pair of slits 262 is formed in the flat portion 260A in such a manner as to penetrate the obverse and reverse sides thereof. A pair of abutting pins 266 and 268 of a second inserting mechanism 264, i.e., a second inserting means, are respectively inserted in the slits 262.

The second inserting mechanism 264 is disposed on the underside of the receiving table 260. Underneath the receiving table 260, a support shaft 270 is disposed along the widthwise direction of the receiving table 260, and is rotatably supported via bearings 274 to a pair of L-shaped brackets 272 fixed to the underside of the receiving table 260.

The opposite ends of the support shaft 270 project outwardly of the brackets 272. Blocks 276 are secured to their respective distal ends of brackets 272. Abutting pins 266 and 268 are disposed vertically on these blocks 276.

The support shaft 270 is supported by an L-shaped bracket 282, a sprocket 278 being secured in the vicinity of the bracket 282. An endless belt 280 is stretched between and wound around the sprocket 278 and a sprocket 286 secured to a drive shaft 284A of a motor 284. The motor 284 is fixed to an L-shaped bracket 288 one end of which is secured to the underside of the receiving table 260.

Accordingly, as the motor 284 is actuated, the support shaft 270 rotates, which in turn causes the blocks 276 at the opposite ends thereof to rotate. As a result, the abutting pins 266 and 268 swing, causing the transporting sheet assembly 37 on the receiving table 260 to be inserted into a nip between the heating transfer rollers 202 and 206 and moving to the lower side of the receiving table 260 through the slits 262.

The image transfer apparatus 10 is provided with a control unit 290 for controlling the operation of the image transfer apparatus 10. A description will now be given of electrical connections between the control unit 290 and various components with reference to a block diagram shown in FIG. 10. The control unit 290 comprises a RAM 292, a ROM 294, a CPU 296, and input/output ports 298, which are connected to each other via a data bus 300.

Figure 10:
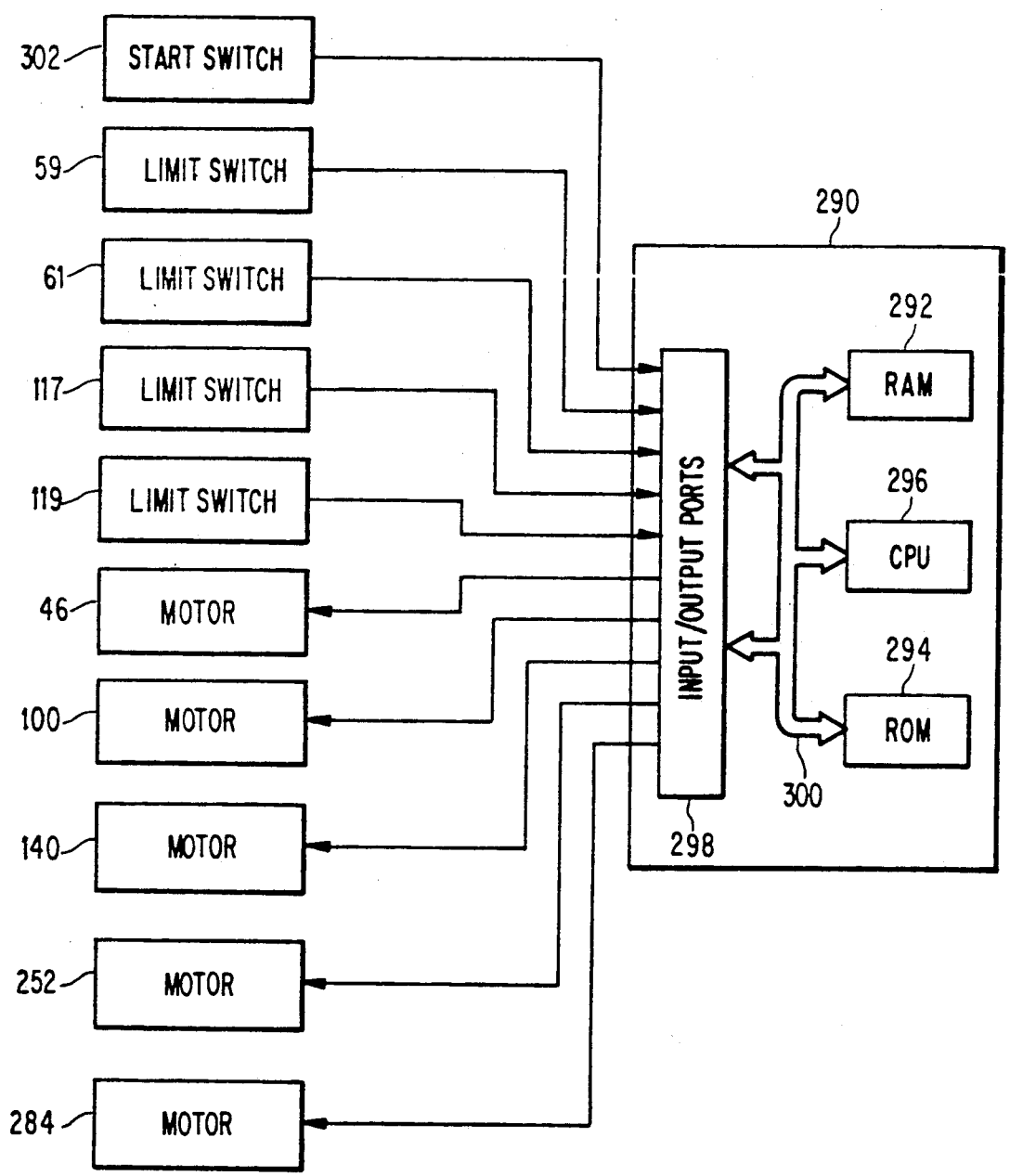

As shown in FIG. 10, a start switch 302 and limit switches 59, 61, 117, and 119 are connected to the input side of the input/output ports 300. In addition, the motors 46, 100, 140, 252, and 284 are connected to the output side thereof.

Figure 11:
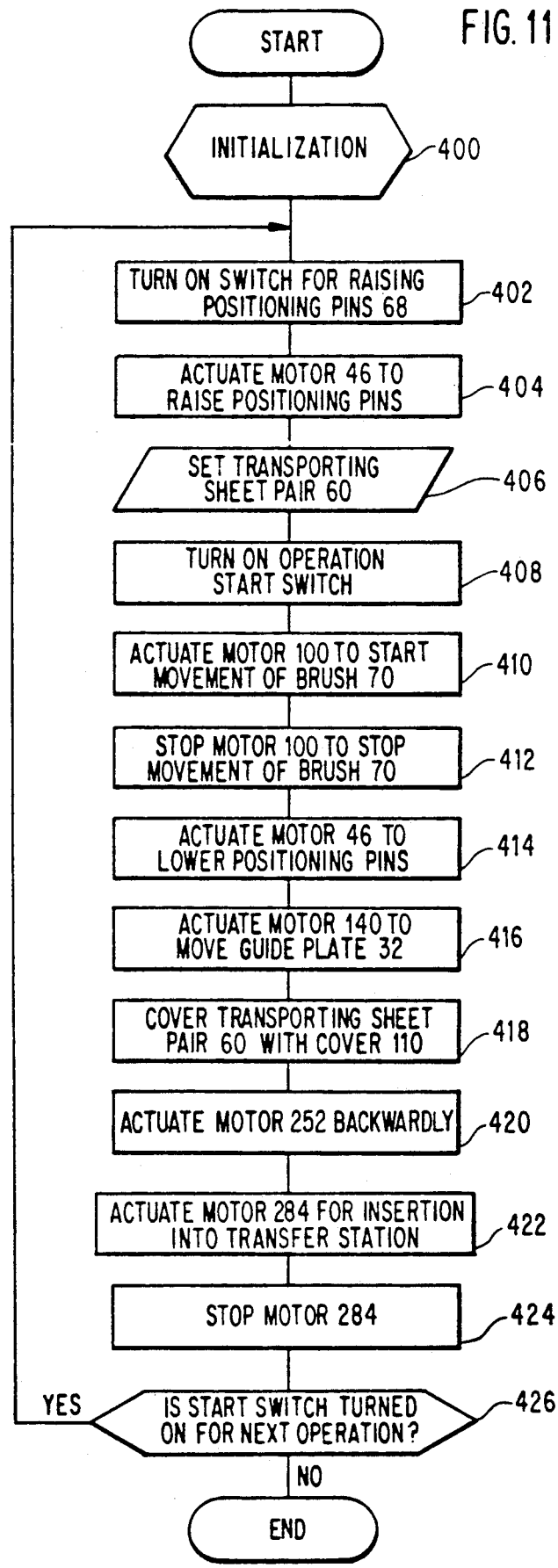

Referring now to a flowchart shown in FIG. 11, a description will be given of the operation of this embodiment.

When the image transfer apparatus 10 is turned on by means of the start switch 302, the initialization of the image transfer apparatus 10 is executed in Step 400. The motor 252 is actuated by this initialization, which in turn causes the heating transfer rollers and 206 to rotate clockwise as viewed in FIG. 1 206 to rotate clockwise as viewed in FIG. 1. The brush 70 is located at a position closer to the insertion side.

Furthermore, the heaters 180, 224, and 240 inserted in the roller 162 and the heating transfer rollers 202 and 206 are energized to heat the roller 162 and the heating transfer rollers 202 and 206.

When the temperatures of the roller 162 and the heating transfer rollers 202 and 206 have risen, reached a state permitting transfer, the start switch for raising the positioning pins 68 is turned on (Step 402).

In this state, in Step 404, the motor 46 is actuated, and the flat bar 38 as well as the positioning pins 68 are raised. As a result, the flat bar 38 is inserted into the rectangular opening 30A formed in the working table 30, and the positioning pins 68 project through the through holes 32A of the guide plate 32 and above the guide plate 32. The positioning holes 28A of the image-receiving sheet 28 are received by the positioning pins 68 so as to be set on the guide plate 32. The positioning holes 26A of the image sheet 26 are then received by the positioning pins 68 so as to be set on the image-receiving sheet 28. In this case, the image sheet 26 and the image-receiving sheet 28 can be readily positioned by using the positioning pins 68.

After the transporting sheet assembly 35 is set on the working table 30 in Step 406, the unillustrated start switch is turned on by the operator in Step 408.

In Step 410, the motor 100 is actuated, and the brush 70 starts moving from the inserted side of the transporting sheet pair 60 toward the other side thereof. As a result, air remaining between the image sheet 26 and the image-receiving sheet 28 is eliminated and the sheets 26 and 28 are thus made flat.

When the brush 70 moves to a position immediately located before the tacking station 20, the operation of the motor 100 is stopped and the movement of the brush 70 stops in Step 412.

Subsequently, in Step 414, the motor 46 is actuated to lower the positioning pins 68. As a result, the positioning pins 68 come off the guide plate 32. In Step 416, the motor 140 is actuated, so that the guide plate 32 moves the working table 30 by the first inserting mechanism 112 toward the tacking station 20. The cover sheet 110, retained by the guide plate 32, has already been taken up by the takeup device 19, so that the as the guide plate 32 moves, the cover sheet 110 is drawn out from the takeup device 19 against the urging force of the spring 504.

The transporting sheet assembly 35 inserted into a nip between the tacking roller 158 and the roller 162 is transported in a clamped state and is inserted into a nip between the heating transfer rollers 202 and 206 of the transfer station 22 and is clamped thereby. The image sheet 26 and the image-receiving sheet 28 are tacked to each other by the tacking roller 158. Since the tacking roller 158 is formed into the configuration of a skewer-type roller, a plurality of tacking positions are provided along the direction of travel of the transporting sheet assembly 35. For this reason, air between the adjacent tacking positions is liable to be removed in the backward direction with respect to the direction of travel. This air is pushed out when the transporting sheet assembly 35 is transported in a clamped state by the heating transfer rollers 202 and 206 in an ensuing Step 416, so that there is no occurrence of bubbles between the image sheet and the image-receiving sheet during transfer.

In this case, in Step 418, as the transporting sheet pair 60 is transported, the cover 110 covers the upper portion of the transporting sheet pair 60 while being drawn out from the takeup device 19.

The image recorded on the image sheet 26 is transferred to the image-receiving sheet 28 by being subjected to pressurization and heating as the transporting sheet assembly 35 is transported in a clamped state by the heating transfer rollers 202 and 206. The transporting sheet assembly 35 which has undergone transfer in the transfer station 22 is sent to the receiving station 24.

When the transporting sheet assembly 35 is sent to the receiving station 24, in Step 420, the motor 252 is rotated backwardly, which in turn causes the heating transfer rollers 202 and 206 to rotate backwardly. In this state, the motor 284 is actuated in Step 422. The actuation of the motor 284 causes the abutting pins 266 and 268 to move, so that the transporting sheet assembly 35 is inserted again into a nip between the heating transfer rollers 202 and 206.

Since the heating transfer rollers 202 and 206 are rotating backwardly, the transporting sheet assembly 35 is again subjected to transfer while being clamped and transported by the heating transfer rollers 202 and 206, and is inserted into a nip between the tacking roller 158 and the roller 162.

In Step 424, at the point when the transporting sheet assembly 35 is sent out from the tacking station 20, the operation of the motor 282 is stopped, so that the movement of the guide plate 32 stops. At this juncture, the transporting sheet assembly 35 is sent out to the working station 18.

This completes transfer. During the movement of the guide plate 32 from the receiving station 24 to the working station 18, the cover sheet 110 is constantly taken up onto the takeup roller 502 by means of the spring 505 of the takeup device 19. Accordingly, in conjunction with the movement of the guide plate 32 from the receiving station 24 to the working station 18, the cover sheet 110 is gradually taken up by the takeup device 19, and at the point when the guide plate 32 has reached the working station 18, the cover sheet 110 is completely exfoliated from the transporting sheet assembly 35, i.e., the state of the transporting sheet pair 60 in which the image sheet 26 is superposed on the image-receiving sheet 28 is obtained.

Accordingly, the operator need not tuck up the cover sheet 110 for the guide plate 32, and it suffices to merely remove the image-receiving sheet 28 from the guide plate 32 after exfoliating the base layer of the image sheet 26 from the image-receiving sheet 28.

Then, in Step 426, the operator judges whether the process is to return to a series of steps starting with Step 402 or the operation is to be ended. In the case where the process is to return to the series of steps starting with Step 402, the ensuing steps are executed.

Thus, in this embodiment, if the cover sheet 110 is attached to the takeup roller 502, the operator subsequently need not touch the cover sheet 110, so that the possibility of damaging or staining the cover sheet 110 during the manual operation can be eliminated. In addition, while the operator is engaged in an operation on the working table during, for instance, the positioning of the image-receiving sheet 28 and the image sheet 26, since the cover sheet 110 has been taken up in the takeup device 19, it is possible to obviate the conventional drawback wherein the cover sheet 110 tucked over the transfer station 22 slips down to the working table, hampering the operation.

A description will now be given of a second embodiment of the present invention.

Figure 12:
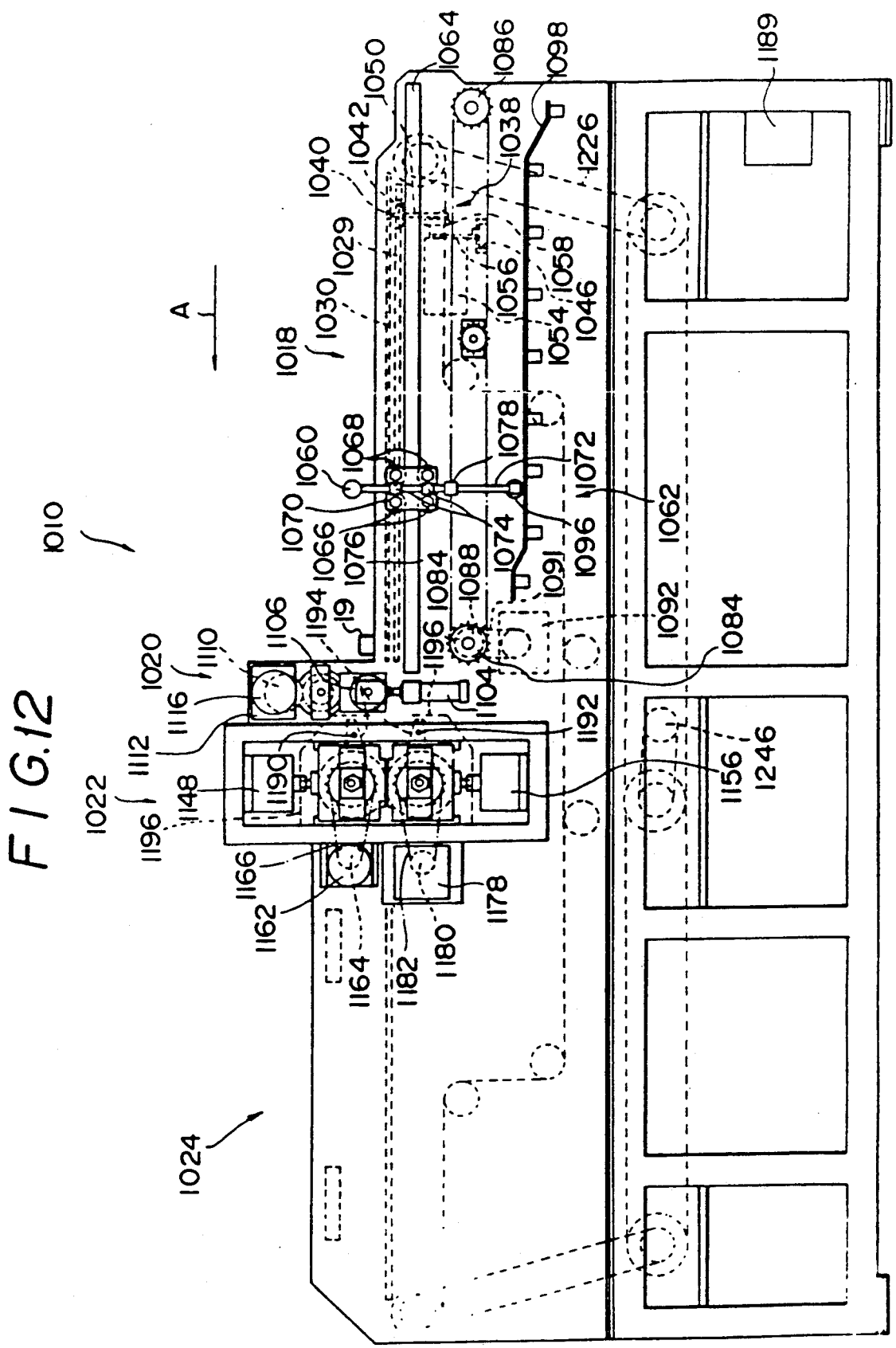
Figure 13:
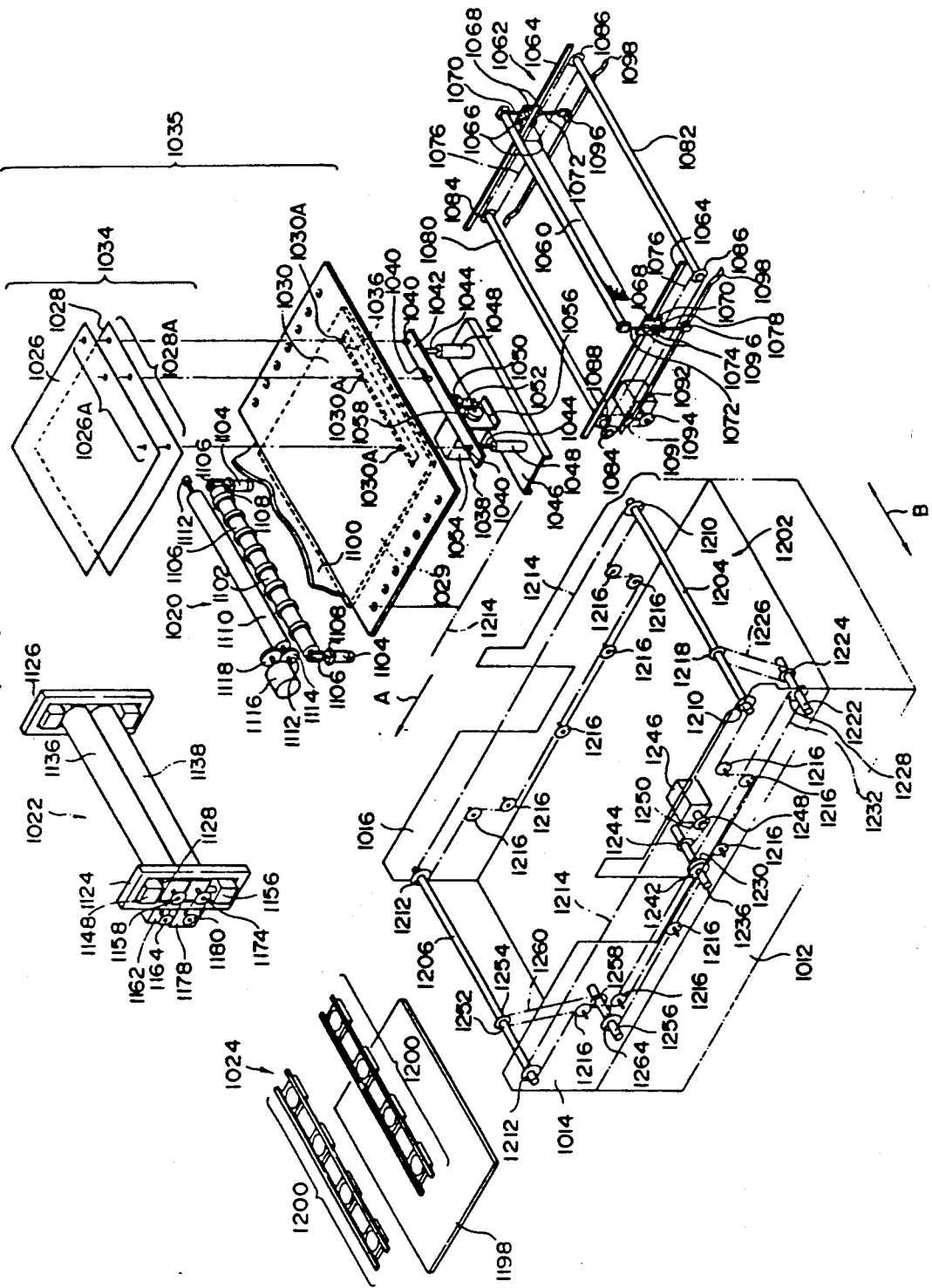

FIGS. 12 and 13 illustrate an image transfer apparatus 1010 in accordance with the second embodiment. FIG. 12 is a left-hand side view showing schematic construction of the image transfer apparatus 1010, and FIG. 13 is an exploded perspective view of the image transfer apparatus.

<Image Transfer Apparatus>

As shown in FIGS. 12 and 13, the image transfer apparatus 1010 has a pair of side plates 1014 and 1016 vertically disposed on a machine base 1012, and includes a working station 1018, tacking station 1020, transfer station 1022 and receiving station 1024 successively disposed in the lengthwise direction of the machine base 1012. Also, the image transfer apparatus 1010 has the same takeup device 19 as that used in the first embodiment. An image sheet 1026 having an image printed thereon and an image-receiving sheet 1028 are placed one above the other, and are transported through the working station 1018, tacking station 1020, transfer station 1022 and receiving station 1024, and are then transported in an opposite direction to return to the working station 1018, thereby allowing the image on the image sheet 1026 to be transferred to the image-receiving sheet 1028.

The working station 1018 includes a working table 1029 disposed between the side plates 1014 and 1016. The working table 1029 is supported on both sides by the side plates 1014 and 1016, and has a guide plate 1030 rested on the upper surface thereof. The image-receiving sheet 1028 and the image sheet 1026 are placed in this order on the guide plate 1030 one above the other, i.e., in superposed relation. The opposite side portions of the guide plate 1030 are connected to a pair of chain belts 1214 (to be described later), respectively, and the guide plate 1030 is transported by the chain belts 1214 in the lengthwise direction (in the direction of arrow A) of the image transfer apparatus 1010. As a result of this transport, a transporting sheet pair 1034 constituted by the image sheet 1026 and the image-receiving sheet 1028 placed one above the other is guided to the tacking station 1020.

A rectangular opening 1036 is provided in the working table 1029 on a trailing side thereof in the transporting direction in such a manner as to extend along the widthwise direction of the image transfer apparatus 1010 (in the direction of double-headed arrow B). A flat bar 1042 adapted to move vertically by means of a positioning mechanism 1038 is inserted in this opening 1036.

As shown in FIGS. 12 and 13, the positioning mechanism 1038 is disposed under the working table 1029. A plurality of positioning pins 1040 of the positioning mechanism 1038 are disposed vertically on the flat bar 1042. Intervals of these positioning pins 1040 are set in correspondence with those of rectangular through holes 1030A formed in the guide plate 1030 for positioning on the working table 1029 the transporting sheet pair 1034 with the image sheet 1026 placed on the image-receiving sheet 1028 one above the other.

The positioning pins 1040 are arranged corresponding to positioning holes 1026A and 1026A bored through the image sheet 1026 and the image-receiving sheet 1028, respectively, for aligning (registering) the image sheet 1026 and the image-receiving sheet 1028 with each other.

One end each of a pair of shafts are fixed to the flat bar 1042 at its opposite ends on the underside thereof, respectively. The other end of each of the shafts 1044 are inserted in a pair of slide bearings 1048, respectively. The slide bearings 1048 are secured on a base 1046 fixed to the side plates 1014 and 1016, and support the shafts 1044 in so as to render the shafts 1044 axially movable.

In addition, a bracket is fixed to the underside of a longitudinally intermediate portion of the flat bar 1042, and one end of a connecting bar 1052 is connected to the flat bar 1042 via the bracket 1050. The other end of the connecting bar 1052 is eccentrically connected to a rotary plate 1058 fixed to a drive shaft of a motor 1054. The motor 1054 is fixed to the base 1046 via an attachment bracket 1056. Accordingly, as the motor 1054 is driven, the connecting bar 1052 moves vertically, which in turn causes the flat bar 1042 to move vertically.

Above the working station 1018, there is disposed a brush 1060 extending along the widthwise direction (indicated by arrow B) of the working table 1029. The brush 1060 can be moved by a brush drive mechanism 1062 in the direction of travel (indicated by arrow A) of the transporting sheet pair 1034.

The brush drive mechanism 1062 has a pair of guide rails 1064 positioned on the outside of and attached to the side plate 1014 and 1016, respectively. On either side, a pair of guide rollers 1066 and a pair of guide rollers 1068 are disposed to hold one of guide rails 1064 therebetween from above and beneath. These two pairs of guide rollers 1066 and guide rollers 1068 are fixed to a movable plate 1070, whereby the movable plate 1070 is guided in the lengthwise direction (indicated by arrow A) of the guide rail 1064.

A thrust shaft 1072 vertically disposed has its intermediate portion coupled to each movable plate 1070 through slide bearings 1074. This allows the thrust shaft 1072 to move in the direction of travel of the transporting sheet pair 1034, as well as to move vertically.

The thrust shaft 1072 is coupled through a connecting bracket 1078, to a chain belt 1076 disposed to extend in the direction of travel of the transporting sheet pair 1034. This coupling is made such that the thrust shaft 1072 can move vertically with respect to the connecting bracket 1078.

The chain belt 1076 is stretched between and around a pair of sprockets 1084 and 1086. The pair of sprockets 1084 and 1086 are fixed on either side to one ends of a pair of shafts 1080 and 1082 extending between and carried by the side plates 1014 and 1016. The sprockets 1084 and 1086 are arranged outside the side plates 1014 and 1016.

A sprocket 1088 is provided on the shaft 1088 between the side plates 1014 and 1016. A chain belt 1091 is stretched between and wound around the sprocket 1088 and a sprocket 1094 fixed to a drive shaft of a motor 1092. The motor 1092 is secured to the side plate 1014 via an attachment bracket. As a result, the torque of the motor 1092 is transmitted to the shaft 1080 via the sprockets 1094 and 1088, and to the chain belt 1076 via the sprocket 1084, thereby rotating the endless chain belt 1076.

A pair of guide rollers 1096 is attached to respective lower ends of the pair of thrust shafts 1072, and rested on the upper surfaces of a pair of guide plates 1098. The guide plates 1098 are arranged so as to extend in the lengthwise direction of the side plates 1014 and 1016 and fixed in place outside of the side plates 1014 and 1016. The guide plates 1098 are each bent into the stepped form on the side from which the transporting sheet pair 1034 is to be inserted, such that the guide plate 1098 has its distal end located below an intermediate portion thereof. The guide plates 1098 are each also bent into the stepped form in its rear end, i.e., on the side near the tacking station 1020, such that the rear end is located above the intermediate portion of the guide plate 1098. Therefore, the brush 1060 is forced to located below the intermediate portions of the guide plates 1098 for ease of the inserting operation by an operator, while the distal end of the brush 1060 is located above apart from the transporting sheet pair 1034 on the side near the tacking station 1020.

One end of a cover sheet 1100 is fixed to the guide plate on the side of the tacking station 1020, and the other end of the cover sheet 1100 is adapted to be taken up by the takeup device 19 described in relation to the first embodiment.

The transporting sheet pair 1034 constituted by the image sheet 1026 and the image receiving sheet 1028 placed one above the other is transported to the tacking station 1020. At that juncture, while the cover sheet 1100 previously taken up by the takeup device 19 is being drawn out from the takeup device 19 during transport of the transporting sheet pair 1034, the upper sheet of the transporting sheet pair 1034 is covered with this cover sheet 1100.

Figure 14:
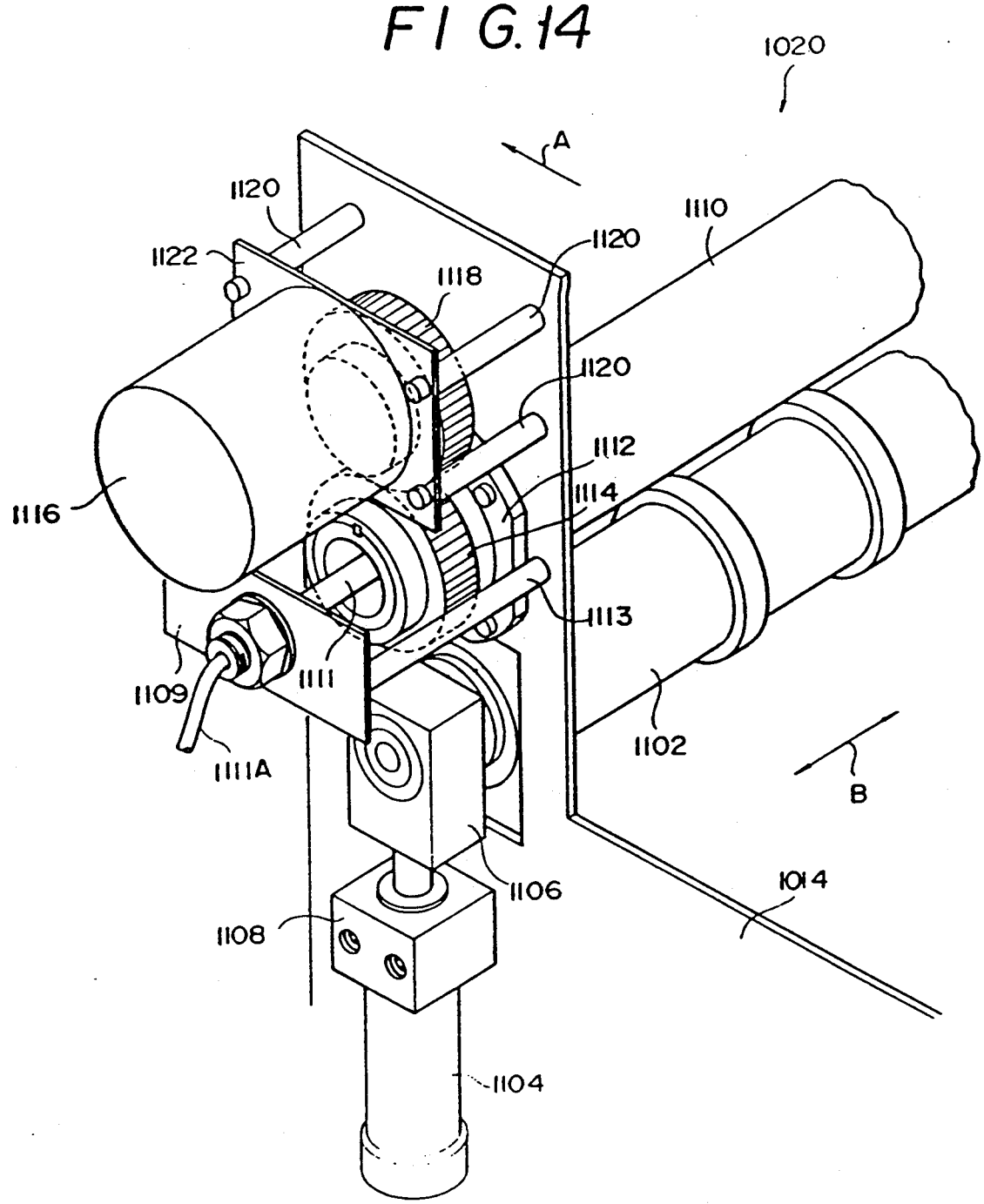

As shown in FIGS. 12, 13 and 14, the tacking station 1020 has a tacking roller 1102 extending between and carried by the side plates 1014 and 1016. This tacking roller 1102 is a skewer-type roller, and the opposite ends of its rotational shaft project outwardly of the side plates 1014 and 1016 and are supported by a pair of bearings 1106, respectively. The bearings 1106 are each fixed to a distal end of a driving shaft of each of a pair of air cylinders 1104. The air cylinders 1104 are secured to the side plates 1014 and 1016 via attachment brackets 1108. This tacking roller is adapted to move vertically as the air cylinders 1104 are actuated.

Above the tacking roller 1102, a heat roller 1110 extends between and is carried by the side plates 1014 and 1016, and is supported by the side plates 1014 and 1016 via bearings 1112. The tacking roller 1102, when raised, is brought into contact with the heat roller 1110. This heat roller 1110 has a hollow configuration, a bar heater 1111 being inserted therein to heat the heat roller 1110.

The opposite end portions of the bar heater 1111 project outwardly of the opposite ends of the heat roller 2110, and are supported by a pair of support plates 1109, respectively. The support plates 1109 are fixed to the side plates 1014 and 1016 via stays 184, respectively.

Connected to a terminal of the bar heater 1111 is one end of a lead wire 1111A. The other end of lead wire 1111A is connected to an unillustrated power supply. As a result, the bar heater 1111 is energized so as to effect heating.

A gear 1114 is fixed to a distal end of the heat roller 1110 between the side plate 1014 and the support plate 1109. This gear 1114 meshes with a gear 1118 fixed to a drive shaft of a motor 1116. The motor 1116 is mounted on a mounting plate 1122 which is secured to the side plate 1014 by means of stays 1120. Accordingly, as the motor 1116 is driven, the heat roller 1110 is rotatably driven.

Figure 15:
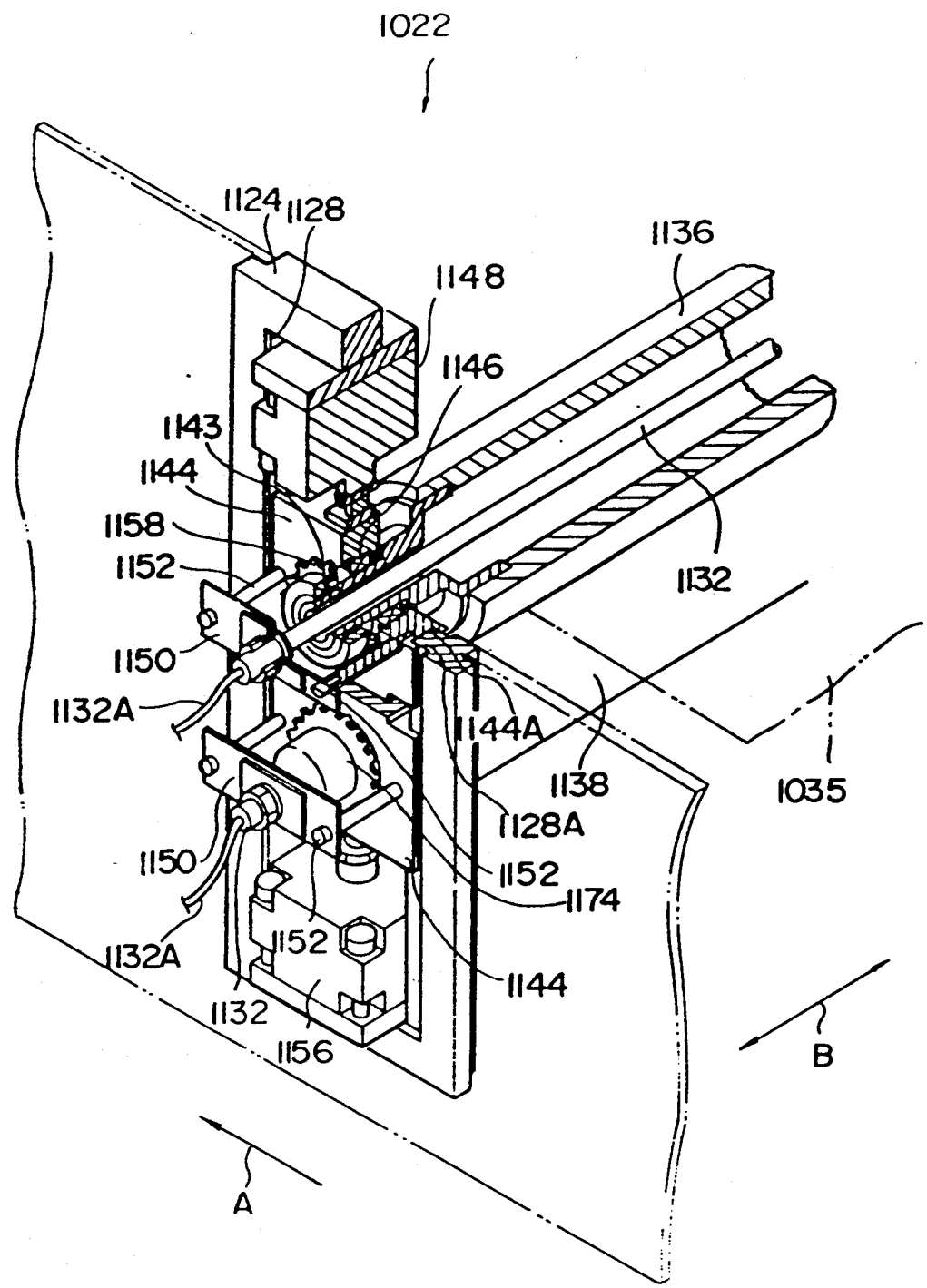

As shown in FIGS. 13 and 15, the transfer station 1022 has frames 1124 and 1126 fixed to the side plates 1014 and 1016, respectively. The frames 1124 and 1126 are each provided with a rectangular opening 1128.

A pair of heating transfer rollers 1136 and 1138 are disposed between the frames 1124 and 1126.

The heating transfer roller 1136 is disposed in correspondence with an upper portion of the opening 1128, while the heating transfer roller 1138 is disposed in correspondence with a lower portion of the opening 1128. A transporting sheet assembly 1035 is inserted into a nip between the heating transfer rollers 1136 and 1138.

The structures for supporting the heating transfer rollers 1136 and 1138 to the frames 1124 and 1126 are the same, and a description will first be given of the structure for supporting the heating transfer roller 1136 to the frame 1124.

Figure 16:
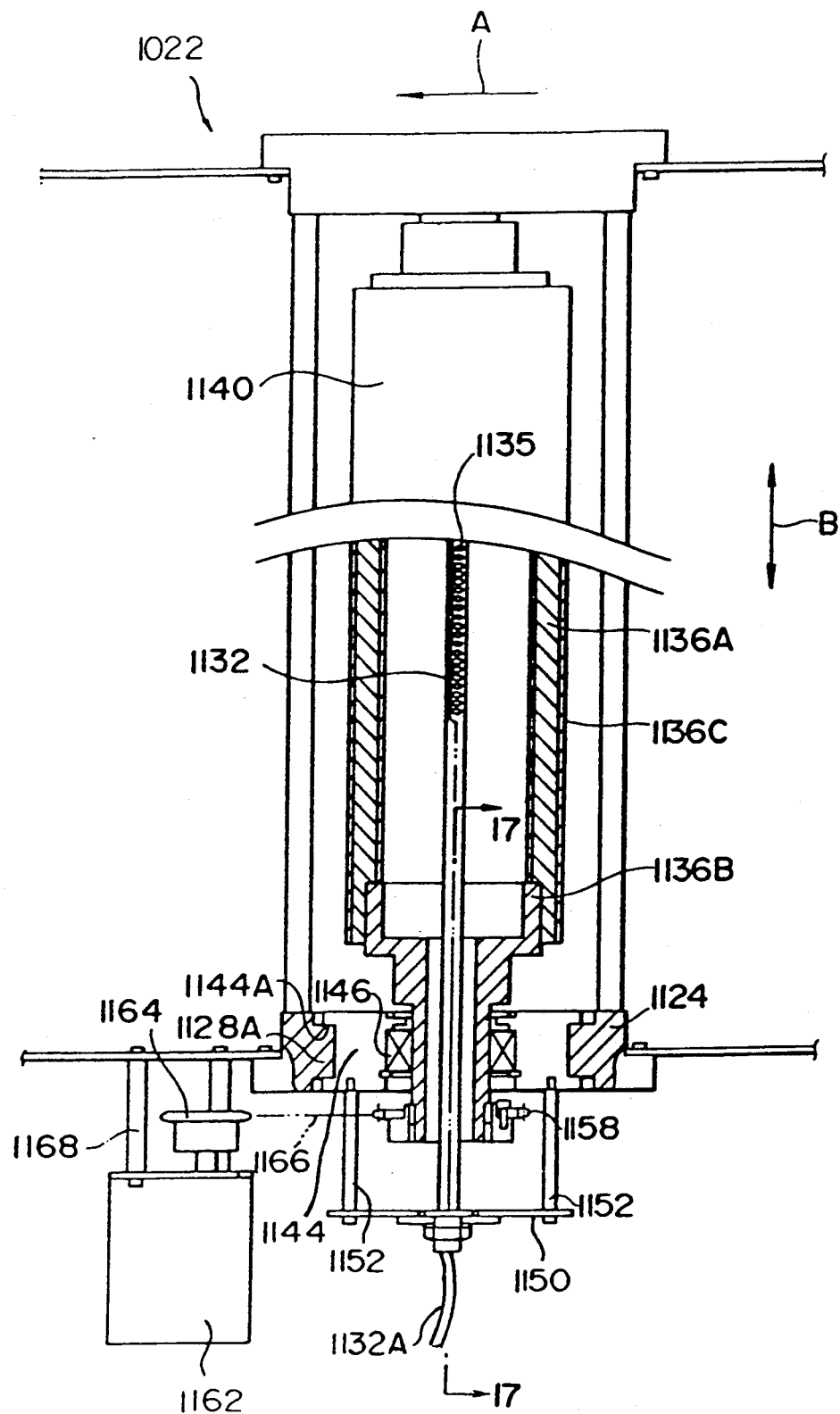

As shown in FIGS. 15 and 16, the opposite ends of a rotating shaft of the heating transfer roller 1136 are supported to a pair of support blocks 1144 via bearings 1146. An air cylinder 1148 is supported on an upper inner wall portion of the opening 1128, and a rod of the air cylinder 1148 and the support block 1144 are coupled to each other. A groove 1144A is provided in each side portion of the support block 1144, a projection 1128A provided on each opposing wall of the opening 1128 being inserted in each groove 1144A. As a result, as the air cylinder 1148 is driven, the support block 1144 is capable of moving vertically while being guided by the projections 1128A.

Figure 17:
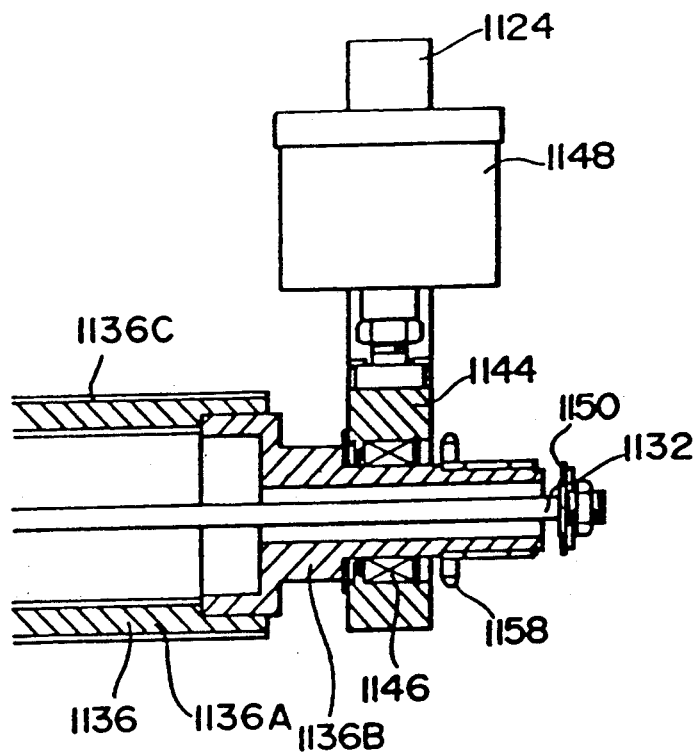

As shown in FIGS. 15, 16, and 17, the heating transfer roller 1136 supported to the support block 1144 has a hollow configuration and a bar heater 1132 is inserted therein. The opposite end portions of the bar heater 1132 project outwardly of the opposite ends of the heating transfer roller 1136 and are supported to support plates 1150 disposed outside the frames 1124 and 1126, respectively.

The support plate 1150 is supported to the support block 1144 via a pair of stays 1152.

In addition, the heating transfer roller 1138 disposed below the heating transfer roller 1136 is supported to the support block 1144 via the bearing 1146 in the same way as the heating transfer roller 1136. In this case, the support block 1144 supporting the heating transfer roller 1138 is coupled to a rod of an air cylinder 1156 supported on a lower inner wall portion of the opening 1128 provided in the frame 1124, and is vertically movable in the same way as the heating transfer roller 1136.

Also, the heating transfer roller 1138 has the bar heater 1132 inserted in its hollow interior, the opposite ends of the bar heater 1132 are supported by the support plates 1150.

When the air cylinders 1148 and 1156 are actuated, the heating transfer rollers 1136 and 1138 move in a mutually approaching direction to press and clamp the transporting sheet assembly 1035.

The structure of the heating transfer rollers 1136 and 1138 are similar and will be described through the heating transfer roller 1136.

The heating transfer roller 1136 has a shaft portion 1136B welded onto each opposite end of a hollow roller body 1136A, the shaft portion 1136B being pivotally supported by the bearing 1146. Thin-walled pressure and heat-resistant rubber 1136C is attached around an overall outer periphery of the roller body 1136A so as to prevent damage which may otherwise be imparted to the transporting sheet pair 1034.

The bar heater 1132 inserted in the hollow portion of the heating transfer roller 1136 is a sheathed heater having a heating element 1135 sealed therein. This heating element 1135 is arranged such that its portion corresponding to each axially opposite portion of the heating transfer roller 1136, which undergoes a large amount of heat dissipation, is wound thickly, while its portion corresponding to an axially intermediate portion thereof is wound coarsely. Consequently, the amount of heat generated per unit length is greater for the axially opposite portions, which undergo a large amount of heat dissipation, than the intermediate portion. Connected to a terminal of the bar heater 1132 is one end of a lead wire 1132A. The other end of lead wire 1132A is connected to an unillustrated power supply.

The heating transfer roller 1138 has the same structure as the heating transfer roller 1136, and the bar heater is arranged in the same manner. The transporting sheet assembly 1035 is heated uniformly by being pressurized in a clamped state and transported by these heating transfer rollers 1136 and 1138.

Between the support block 1144 and the support plate 1150, a sprocket 1158 is fixed to a distal end of the heating transfer roller 1136 via a one-way clutch 1143. A chain belt 1166 is stretched between and wound around the sprocket 1158 and a sprocket 1164 secured to a drive shaft of a motor 1162. The motor 1162 is secured to the side plate 1014 via a bracket 1168. Accordingly, the torque of the motor 1162 is transmitted to the sprocket 1158 by means of the chain belt 1166 to rotate the heating transfer roller 1136.

In addition, as shown in FIGS. 12 and 13, the heating transfer roller 1138, disposed below the heating transfer roller 1136, has a sprocket 1174 fixed between the support block 1144 and the support plate 1150. A chain belt 1182 is stretched between and wound around the sprocket 1174 and a sprocket 1180 secured to a drive shaft of a motor 1178 (see 1022 in FIG. 13) disposed below the motor 1162 (see FIG. 12). The motor 1178 is secured to the side plate 1014 via a bracket 1184. Accordingly, the torque of the motor 1178 is transmitted to the heating transfer roller 1138 by means of the chain belt 1182, causing the heating transfer roller 1138 to rotate.

Between the side plates 1014 and 1016, auxiliary heaters 1190 and 1192 are disposed upstream of the heating transfer rollers 1136 and 1138 in the direction of travel of the transporting sheet assembly 1035, as shown in FIG. 12. The auxiliary heaters 1190 and 1192 are covered with a cover 1194 which is partially open toward the heating transfer rollers 1136 and 1138 so as to heat the heating transfer rollers 1136 and 1138.

The heating transfer rollers 1136 and 1138 are provided with a cover 1196 via an unillustrated bracket so as to be shielded from the outside. This prevents heat of the heating transfer rollers 1136 and 1138 from being dissipated.

As shown in FIG. 13, a receiving table 1198 is disposed on the receiving station 1024 in such a manner as to extend between the side plates 1014 and 1016. The transporting sheet assembly 1035 sent out from the transfer station 1022 is received by this receiving table 1198.

Fans 1200 are disposed above the receiving table 1198. As a result, the transporting sheet assembly 1035 received on the receiving table is subjected to cooling.

Figure 18:
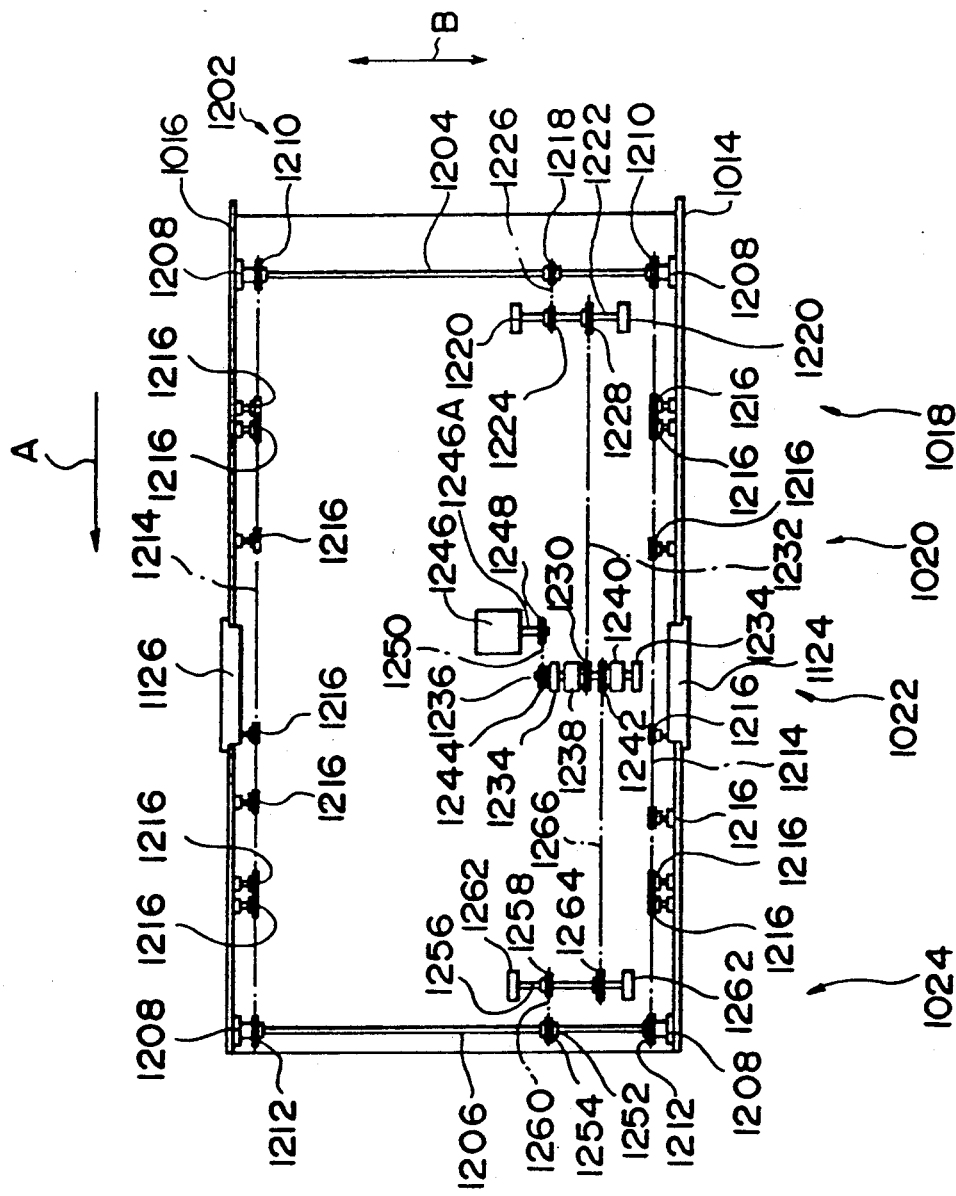

Referring now to FIGS. 13 and 18, a description will be given of a transporting drive system 1202 for moving the transporting sheet assembly 1035 again from the receiving station 1024 to the working station 1018 after the transporting sheet assembly 1035 has been transported from the working station 1018 to the tacking station 1020, transfer station 1022, and then to and receiving station 1024.

As shown in FIG. 18, in the working station 1018 and the receiving station 1024, a pair of shafts 1204 and 1206 extend between and supported by the side plates 1014 and 1016 via bearings 1208. A pair of sprockets 1210 and 1212 are secured to each of the shafts 1204 and 1206. In addition, the sprockets 1210 and 1212 are disposed on the respective inner sides of the side plates 1014 and 1016. A pair of chain belts are stretched between and wound around the sprockets 1210 and 1212 close to the side plate 1014 and close to the side plate 1016, respectively. The opposite sides of the guide plate 1030 are coupled with the chain belts 1214 via brackets. As a result, the guide plate 1030 is transported from the working station 1018 to the receiving station 1024 via the tacking station 1020 and the transfer station by means of the chain belts 1214. The chain belts 1214 are each guided at one location so as to pass by a stepped portion of each of the heating transfer rollers 1136 and 1138, while they are each guided at another location by a respective idle sprocket 1216 supported by the side plates 1014 and 1016, so that their transporting passage is bent.

A transmission sprocket 1218 is secured to an intermediate portion of the shaft 1204. A chain belt 1226 is stretched between the transmission sprocket 1218 and an idle sprocket 1224 secured to the machine base 1012 and supported to a shaft 1222 via a bearing 1220.

In addition, an idle sprocket 1228 is secured to the shaft 1222. A chain belt 1232 is stretched between and wound around this idle sprocket 1228 and a sprocket 1230. The sprocket 1230 is disposed in a central portion of the machine base 1012, and is fixed to a drive shaft 1236 having opposite ends supported by bearings 1234. Disposed between the sprocket 1230 and the drive shaft 1236 is a clutch 1238.

The drive shaft is provided with a sprocket 1242 via a clutch 1240 in the same way as the sprocket 1230. One end portion of the drive shaft 1236 penetrates the bearing 1234, and 1244 secured to a distal end thereof. A chain belt 1250 is stretched between and wound around the sprocket 1244 and a sprocket 1248 secured to a drive shaft 1246A of a motor 1246. The motor 1246 is secured to the machine base 1012. As a result, the torque of the motor 1246 is transmitted to the drive shaft 1236 via sprockets 1248 and 1244. In this case, the torque is transmitted to or disengaged from, the sprockets 1230 and 1242 by means of the clutches 1238 and 1240.

Meanwhile, a sprocket 1254 is coupled to an intermediate portion of the shaft 1206 via a one-way clutch 1252. A chain belt 1260 is stretched between and wound around the sprocket 1254 and a sprocket 1258 secured to a shaft 1256. The shaft 1256 is supported to the machine base 1012 via a bearing 1262.

In addition, a sprocket 1264 is secured to the shaft 1256, a chain belt 1266 being stretched between and wound around the sprocket 1264 and the sprocket 1242. As a result, the torque of the motor 1246 transmitted to the drive shaft 1236 is in turn transmitted to the shaft 1256 via the sprockets 1242 and 1264.

The image transfer apparatus 1010 is provided with a control unit 1189 for controlling the operation of the image transfer apparatus 1010. A description will now be given of electrical connections between the control unit 1189 and various components with reference to a block diagram shown in FIG. 19. The control unit 1189 comprises a RAM 1191, a ROM 1193, a CPU 1195, and input/output ports 1197, which are connected to each other via a data bus 1199.

Figure 19:
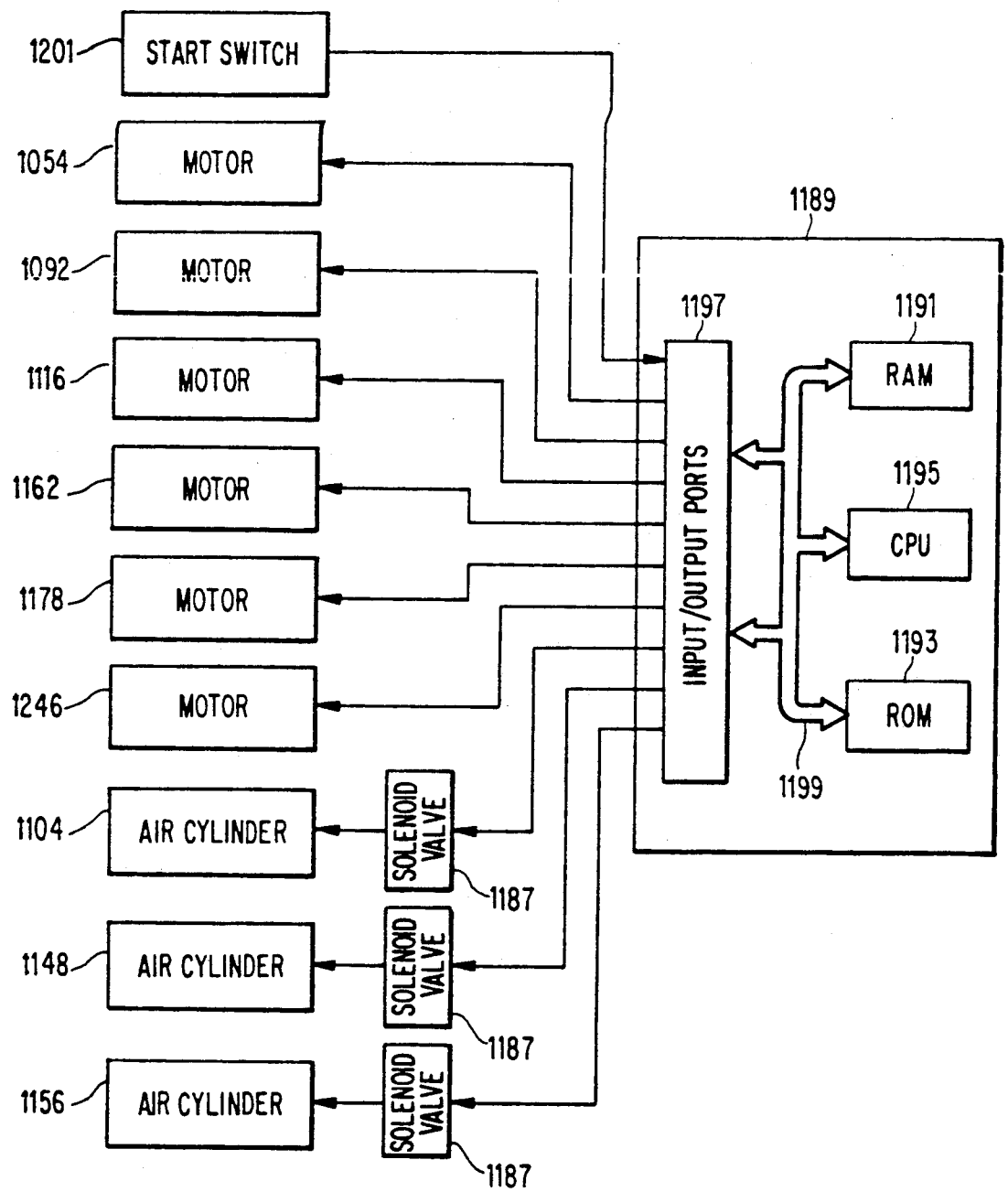

As shown in FIG. 19, a start switch 1201 for starting the image transfer apparatus 1010 is connected to the input side of the input/output ports 1197. In addition, the motors 1054, 1092, 1116, 1162, 1178, and 1246 are connected to the output side thereof. Also, the air cylinders 1104, 1148, and 1156 are connected thereto via solenoid valves 1187.

Figure 20:
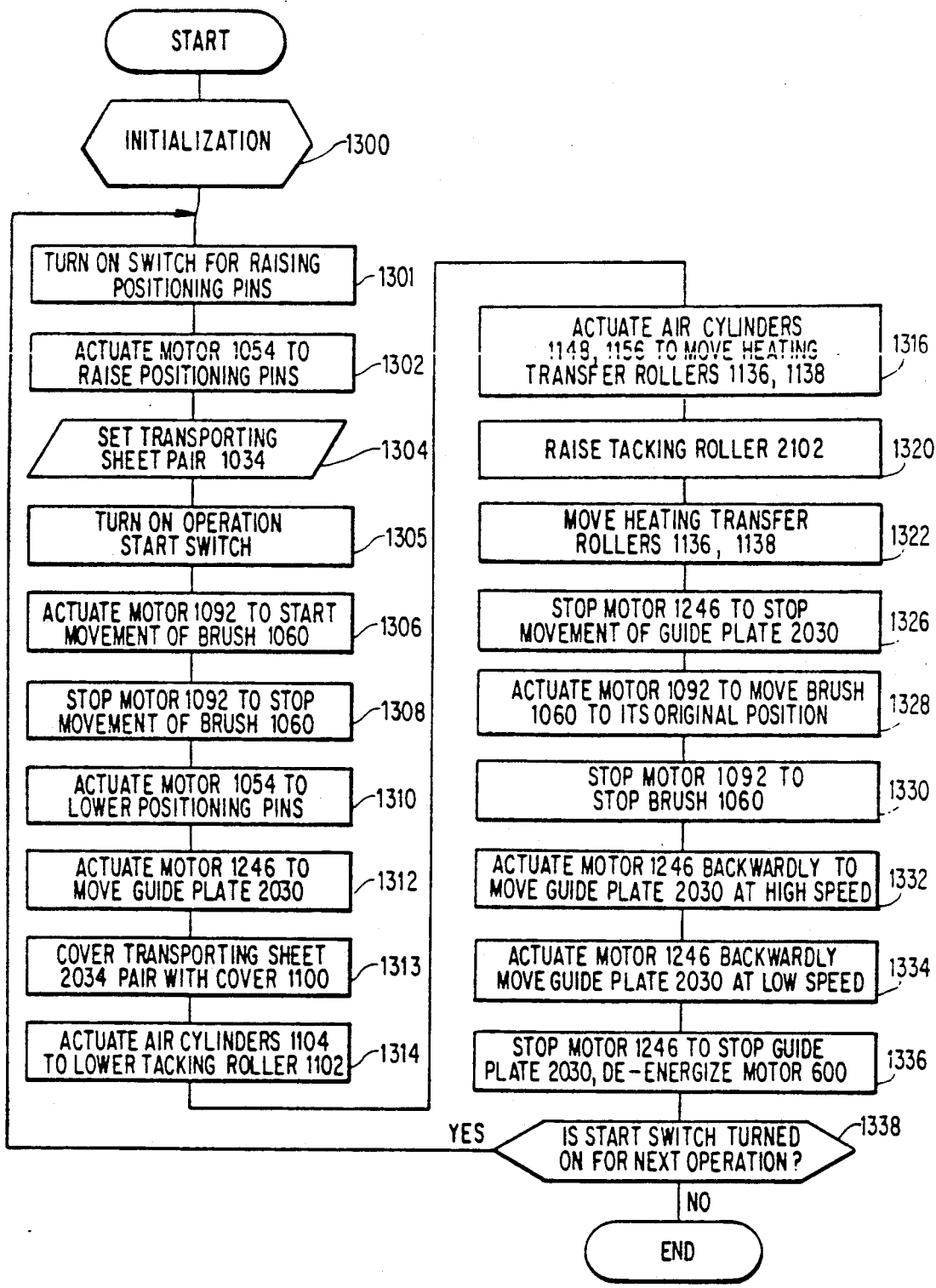

Referring now to a flowchart shown in FIG. 20, a description will be given of the operation of this embodiment.

When the image transfer apparatus 1010 is turned on by means of the start switch 1201, the initialization of the image transfer apparatus 1010 is executed in Step 1300. As a result of this execution, the guide plate 1030 moves to its predetermined position in the working station 1018, while the positioning pins 1040 move to their lower predetermined position. The brush 1060 is positioned on the insertion side of the transporting sheet pair 1034. The tacking roller 1102 moves upwardly by means of the air cylinders 1104 and are brought into pressure contact with the heat roller 1110. The heating transfer rollers 1136 and 1138 have been moved in such a manner as to be spaced apart from each other by means of the air cylinders 1148 and 1156. That is, this is an open state in which the transporting passage for the transporting sheet assembly 1035 is open.

In this state, the motors 1162 and 1178 are started to rotate the heating transfer rollers 1136 and 1138.

Furthermore, the fans 1200 start operating to send air to the receiving station 1024.

By this time, the respective heaters have started heating the heating transfer rollers 1136 and 1138.

When the temperatures of the heating transfer rollers have risen, regulated, and reached a state permitting transfer, the start switch for raising the positioning pins 1040 is turned on (Step 1301).

In this state, in Step 1302, the motor 1054 is actuated, and the flat bar 1042 as well as the positioning pins 1040 are raised. As a result, the flat bar 1042 is inserted into the opening 1036 formed in the working table 1029, and the positioning pins 1040 project through the through holes 1030A of the guide plate 1030 and above the guide plate 1030. The positioning holes 1028A of the image-receiving sheet 1028 are received by the positioning pins 1040 so as to be set on the guide plate 1030. The positioning holes 1026A of the image sheet 1026 are then received by the positioning pins 1040 so as to be set on the image-receiving sheet 1028. In this case, the image sheet 1026 and the image-receiving sheet 1028 can be readily positioned by using the positioning pins 1040.

After the transporting sheet pair 1034 is set on the working table 1029 in Step 1304, the unillustrated start switch is turned on by the operator in Step 1305.

In Step 1306, the motor 1092 is actuated, and the brush 1060 starts moving from the inserted side of the transporting sheet pair 1034 toward the other side thereof. As a result, air remaining between the image sheet 1026 and the image-receiving sheet 1028 is eliminated and the sheets 1026 and 1028 are thus made flat.

When the brush 1060 moves to a position immediately located before the tacking station 1020, the operation of the motor 1092 is stopped and the movement of the brush 1060 stops in Step 1308.

Subsequently, in Step 1310, the motor 1054 is actuated to lower the positioning pins 1040. As a result, the positioning pins 1040 come off the guide plate 1030. In Step 1312, the motor 1246 is actuated, so that the guide plate 1030 moves toward the tacking station 1020 over the working table 1029.

In this case, in Step 1313, in conjunction with the transport of the transporting sheet pair 1034, the cover sheet 1100 taken up by the takeup device 19 is gradually drawn out to cover the transporting sheet pair 1034. Simultaneously, in Step 1314, the air cylinders 1104 are actuated to lower the tacking roller 1102. The transporting sheet pair 1034, beginning with its distal end portion, is subjected to pressurization and heating via the cover 1100 by means of the tacking roller 1102, thereby undergoing tacking. It should be noted that when the tacking roller 1102 is positioned upwardly by means of the air cylinders 1104, the tacking roller 1102 abuts against the heat roller 1110, and is heated thereby.

Since the tacking roller 1102 is formed into the configuration of a skewer-type roller, a plurality of tacking positions are provided along the direction of travel of the transporting sheet assembly 1035. For this reason, air between the adjacent tacking positions is liable to be removed in the backward direction with respect to the direction of travel. This air is pushed out when the transporting sheet assembly 1035 is transported in a clamped state by the heating transfer rollers 1136 and 1138 in an ensuing Step 1316, so that there is no occurrence of bubbles between the image sheet and the image-receiving sheet during transfer.

In Step 1316, the air cylinders 1148 and 1156 are actuated, so that the heating transfer roller 1136 is lowered, while the heating transfer roller 1138 is raised. As a result, the transporting passage for the transporting sheet assembly 1035 is closed, the one-way clutch 1143 provided in the sprocket 1158 acts so that the peripheral speed of the heating transfer roller 1138 and the peripheral speed of the heating transfer roller 1136 are synchronized with each other. In practice, the peripheral speed of the heating transfer roller 1136 is set to be slower than that of the heating transfer roller 1138. The transporting sheet assembly 1035 is inserted into a nip between the heating transfer rollers 1136 and 1138. Thus, image transfer is effected while the transporting sheet assembly 1035 is being pressed and clamped by the heating transfer rollers 1136 and 1138 for heating and while being transported at the same time.

After the transporting sheet assembly 1035 has passed through the tacking station 1020, the tacking roller 1102 is raised in Step 1320. In Step 1322, the heating transfer rollers 1136 and 1138 are moved to open the transporting passage for the transporting sheet assembly 1035.

In this case, the transporting sheet assembly 1035 is transported by the motor 1178 after it has been transported to the transfer station 1022 by the motor 1246. That is, the transporting speed derived from the torque of the motor 1178 is set to be higher than the transporting speed derived from the torque of the motor 1246, and since coupling is provided via the one-way clutch 1252, the transporting sheet assembly 1035 is transported by the motor 1178 for driving the heating transfer rollers 1136 and 1138 during heating transfer.

In Step 1326, at the point when the transporting sheet assembly 1035 has been sent out from the transfer station 1022, the motor 1246 is stopped, thereby stopping the movement of the guide plate 1030. At this time, the transporting sheet assembly 1035 has moved to the receiving station 1024, and the transporting sheet assembly 1035 whose temperature has become high by being heated in the transfer station 1022 is cooled in the receiving station 1024.

In Step 1328, the motor 1092 is actuated, and the brush 1060 starts moving toward its original position. In Step 1330, the motor 1092 is driven backwardly, so that the brush 1060 moves toward the positioning mechanism 1038 and then stops.

Then, in Step 1332, the motor 1246 is driven backwardly, so that the guide plate 1030 moves to the working station 1018 at high speed. The guide plate 1030 which has moved to the end of the working station 1018 at high speed moves at low speed in Step 1334, and stops in Step 1336.

This completes transfer. During the movement of the guide plate 1030 from the receiving station 1024 to the working station 1018, the cover sheet 1100 is gradually taken up by the takeup device 19, and when the guide plate 1030 has reached the working station 1018, the cover sheet 1100 is completely exfoliated from the transporting sheet assembly 1035, i.e., the state of the transporting sheet pair 1034 in which the image sheet 1026 is superposed on the image-receiving sheet 1028 is obtained.

Accordingly, the operator need not tuck up the cover sheet 1100 for the guide plate 1030, and it suffices to merely remove the image-receiving sheet 1028 from the guide plate 1030 after exfoliating the base layer of the image sheet 1026 from the image-receiving sheet 1028.

Then, in Step 1338, the operator judges whether the process is to return to a series of steps starting with Step 300 or the operation is to be ended. In the case where the process is to return to the series of steps starting with Step 1300, the ensuing steps are executed.

It should be noted that although in this embodiment the return of the brush 1060 to its initial position is effected during the cooling of the transporting sheet assembly 1035, the return may be effected after the transporting sheet assembly 1035 has passed through the tacking station 1020, i.e., in Step 1314.

In addition, although in this embodiment a description has been given of a case where the image sheet 1026 is superposed on the image-receiving sheet 1028 to effect transfer, the apparatus of the present invention is also applicable to a case where the image-receiving sheet 1028 for which image transfer has been completed is superposed on transfer sheet such as paper to effect paper transfer. In this case, the transferring operation can be effected without using the positioning pins 1040 of the positioning mechanism 1038 and the tacking roller 1102 of the tacking station 1020.

Figure 21:
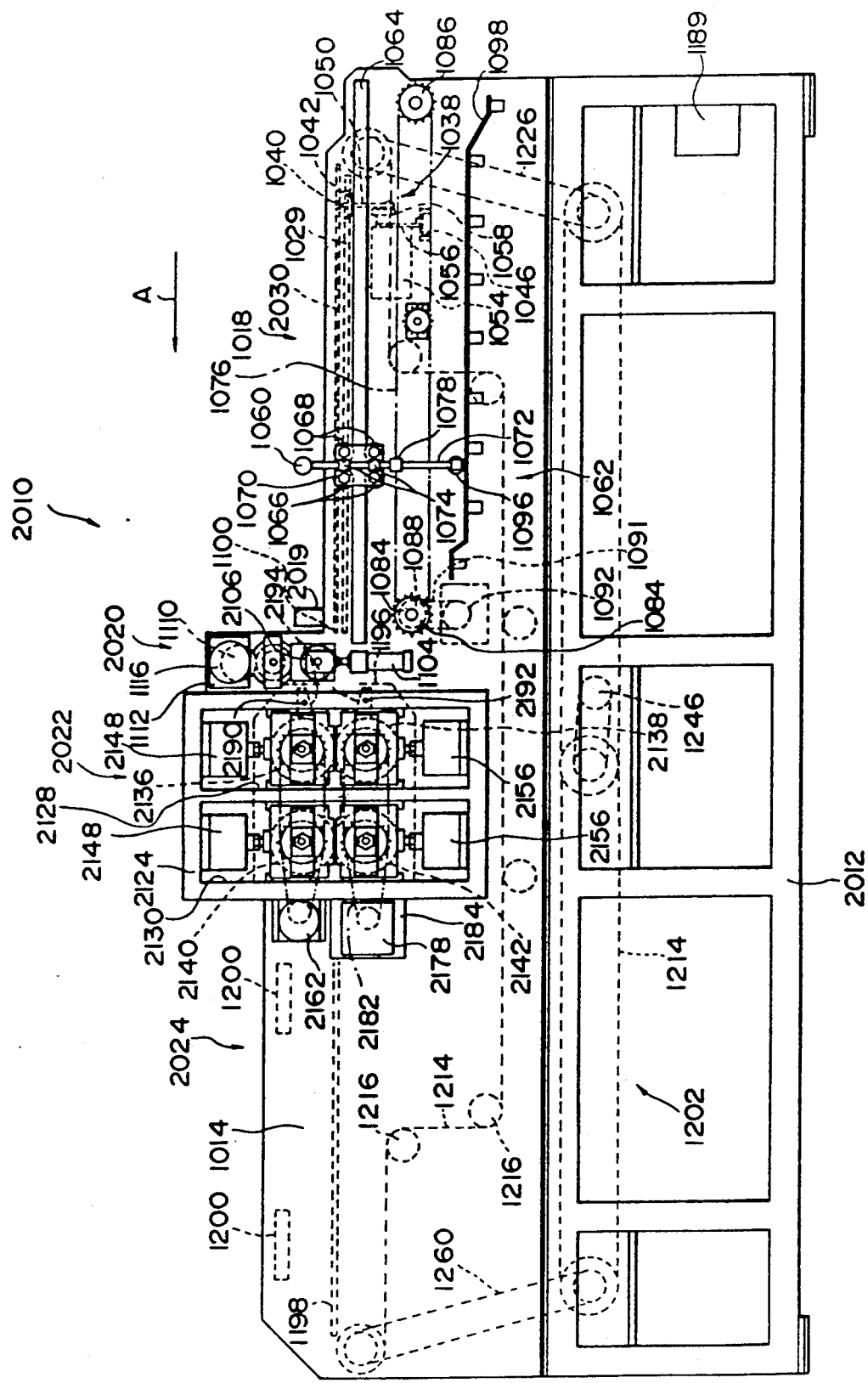
Figure 22:
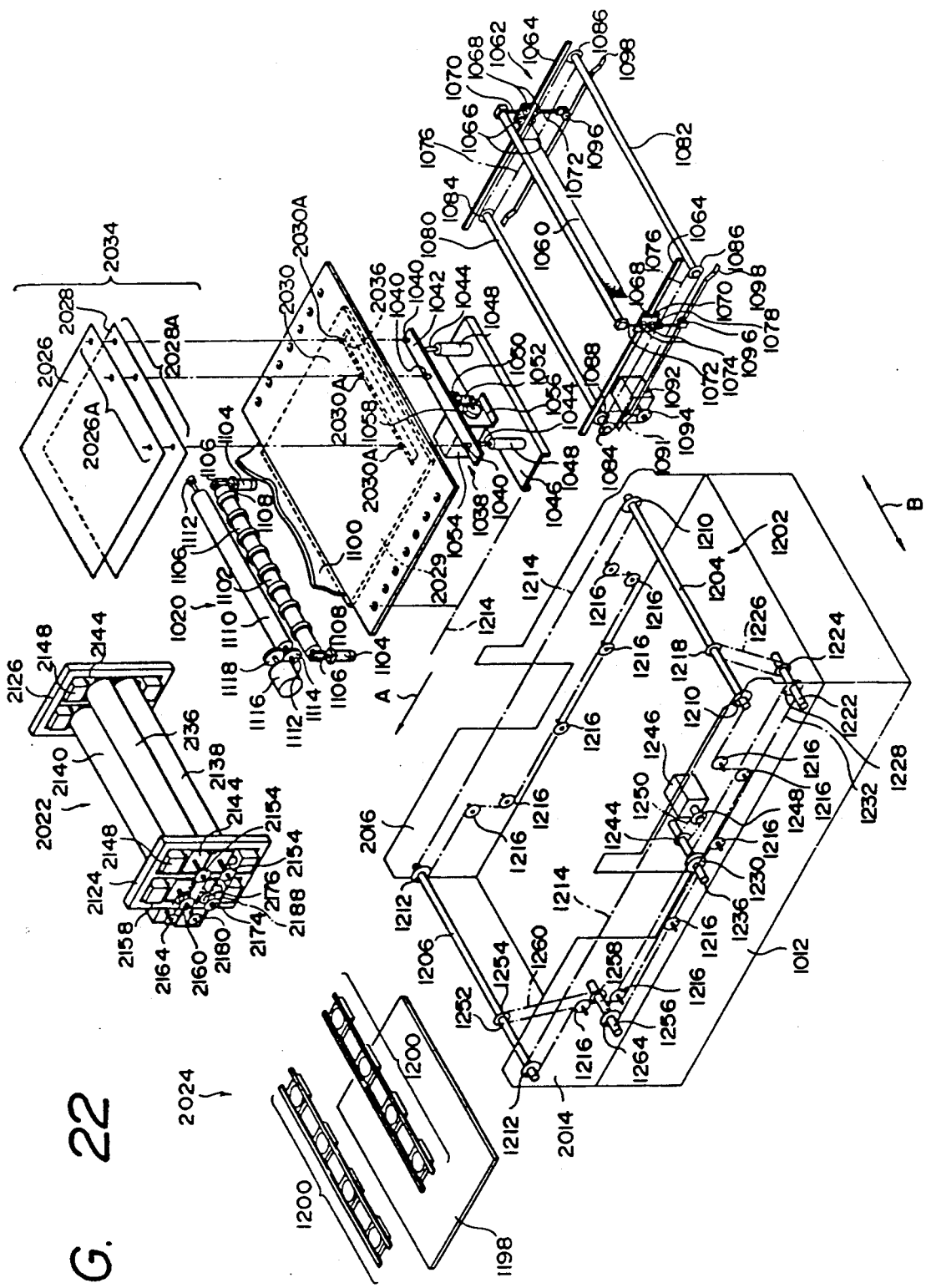

FIGS. 21 and 22 illustrate an image transfer apparatus 2010 in accordance with a third embodiment of the present invention. FIG. 21 is a left-hand side view showing a schematic representation of the image transfer apparatus 2010, and FIG. 22 is an exploded perspective view of the same image transfer apparatus. It should be noted that in the drawings the components as similar to those of the first and second embodiments are denoted by reference numerals, and further description thereof will be omitted.

As shown in FIGS. 21 and 22, the image transfer apparatus 2010 has a pair of side plates 2014 and 2016 vertically disposed on a machine base 2012, and includes a working station 2018, tacking station 2020, transfer station 2022 and receiving station 2024 successively disposed in the lengthwise direction of the machine base 2012. Also, the image transfer apparatus 2010 is provided with a takeup device 2019. An image sheet 2026 having an image printed thereon and an image-receiving sheet 2028 are placed one above the other, and are transported through the working station 2018, tacking station 2020, transfer station 2022 and receiving station 2024, and are then transported in an opposite direction to return to the working station 2018, thereby allowing the image on the image sheet 2026 to be transferred to the image-receiving sheet 2028.

In the third embodiment, only the structure of the transfer station 2022 and the structure of the takeup device 2019 differ from the second embodiment, and the remaining arrangement is identical. Accordingly, identical components are denoted by the same reference numerals, and a description thereof will be omitted.

Figure 22A:
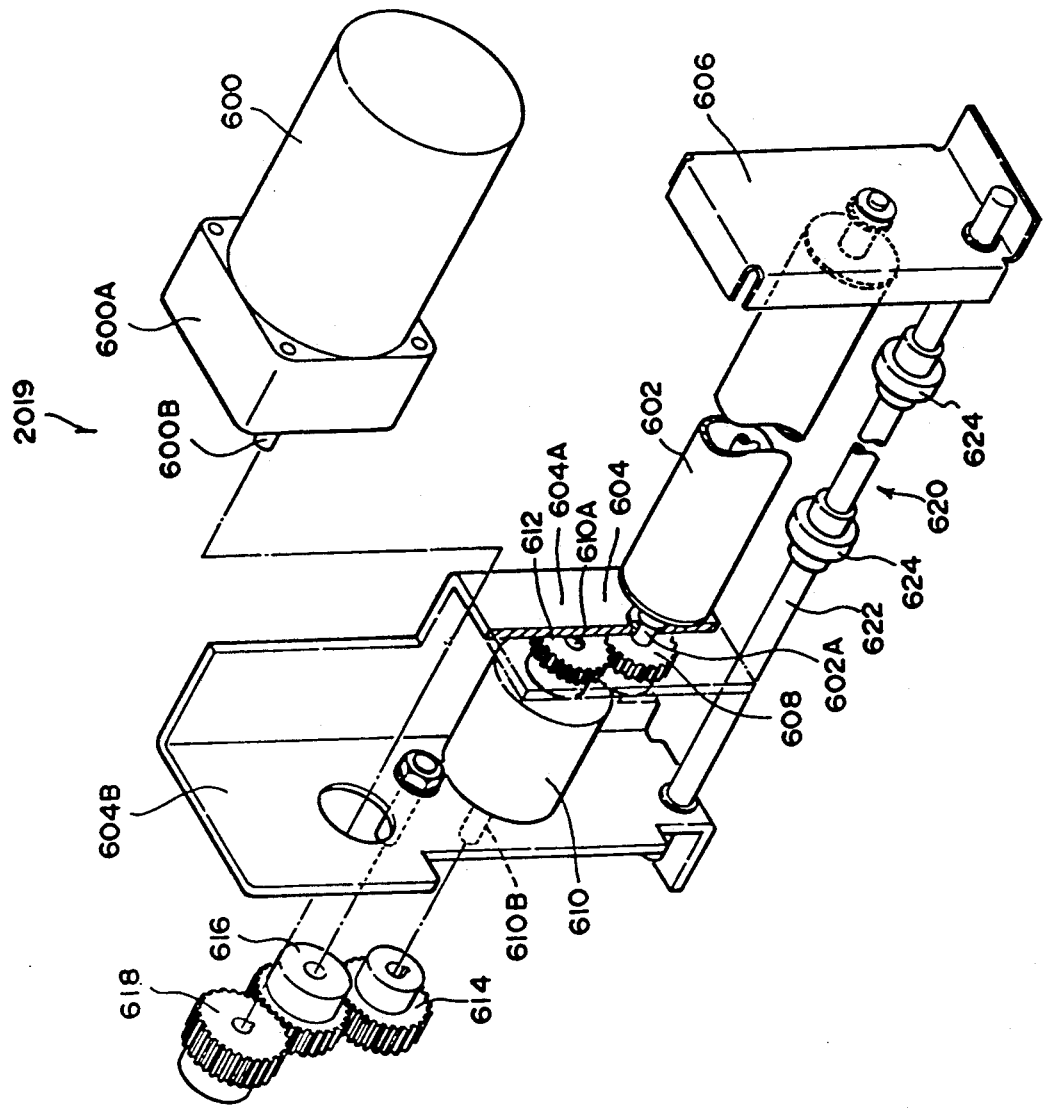
FIG. 22A is an exploded perspective view of a takeup device of the third embodiment.

As shown in FIG. 22A, the takeup device 2019 is arranged such that a takeup roller 602 is rotated by a motor 600 to take up the cover sheet 1100.

The takeup roller 602 has its opposite ends pivotally supported by leg plates 604 and 606. The leg plate 604 has a substantially U-shaped section, and one end portion of a rotating shaft 602A of the takeup roller 602 penetrates a leg piece 604A of the leg plate 604 on the side of the leg plate 606 and is located within the U-shaped section of the leg plate 604. A gear 608 is secured coaxially to this end portion of the rotating shaft 602A. In addition, a micro electromagnetic clutch 610 is disposed in the U-shaped section, and gear 612 meshing with the gear 608 is secured to a shaft 610A of the micro electromagnetic clutch 610 projecting toward the leg piece 604. A gear 614 is secured to a shaft 610B of the micro electromagnetic clutch 610 which penetrates, and extends outwardly of, a shaft 604B of the leg plate 604 opposing the shaft 604A. This gear 614 is coupled to a gear 618 coaxially secured to an output shaft 600B of a gear head 600A of the motor 600 via a transmission gear 616. The micro electromagnetic clutch 610 is arranged such that when the motor 600 is energized, the shaft 610A and the shaft 610B are engaged with each other, while when the motor 600 is not energized, the shaft 610A and the shaft 610B are disengaged from each other.

Accordingly, when the motor 600 is energized, the takeup roller 602 is rotated via the gear 618, the micro elctromagnetic clutch 610, and the like. On the other hand, when the motor 600 is not energized, the takeup roller 602 is disconnected from the output shaft 600B of the gear head 600A of the motor 600 by means of the micro electromagnetic clutch 610, so that the takeup roller 602 is set in a freely rotating state.

When the cover sheet 1100 is attached to the above-described takeup roller 602, and the motor 600 is energized, the cover sheet 1100 is taken up by the takeup roller 602. When the motor 600 is not energized, the cover sheet 1100 is rolled out from the takeup roller 602 by being pulled out in the direction of travel of the transporting sheet pair 1034.

In addition, the takeup device 2019 has a guide portion 620 for smoothly guiding the cover sheet 1100 when the cover sheet 1100 is taken up or rolled out. This guide portion 620 comprises a shaft 622 supported to the leg piece 604B of the leg plate 604 and the leg plate 606, as well as two guide rollers 624 pivotally supported by the shaft 622. Accordingly, in the same way as the guide portion 520 of the first embodiment, the cover sheet 1100 is adapted to move smoothly by abutting against the guide rollers 624 of the guide portion 620 during its travel.

The takeup device 2019 arranged as described above is mounted on the side plates 2014 and 2016 in the vicinity of the tacking station 1020 via the leg plates 604 and 606. After mounting, an end portion of the cover sheet 1110 opposite to its end fixed to a guide plate 2030 is attached to the takeup roller 602 by using an attaching member such as double coated adhesive tape or the like. After this attaching operation is completed, if the motor 600 is energized, the cover sheet 1110, beginning with the end portion thereof opposite to the fixed end, is taken up onto the takeup roller 602.

It should be noted that a the motor 600 may be of available speed type.

Figure 23:
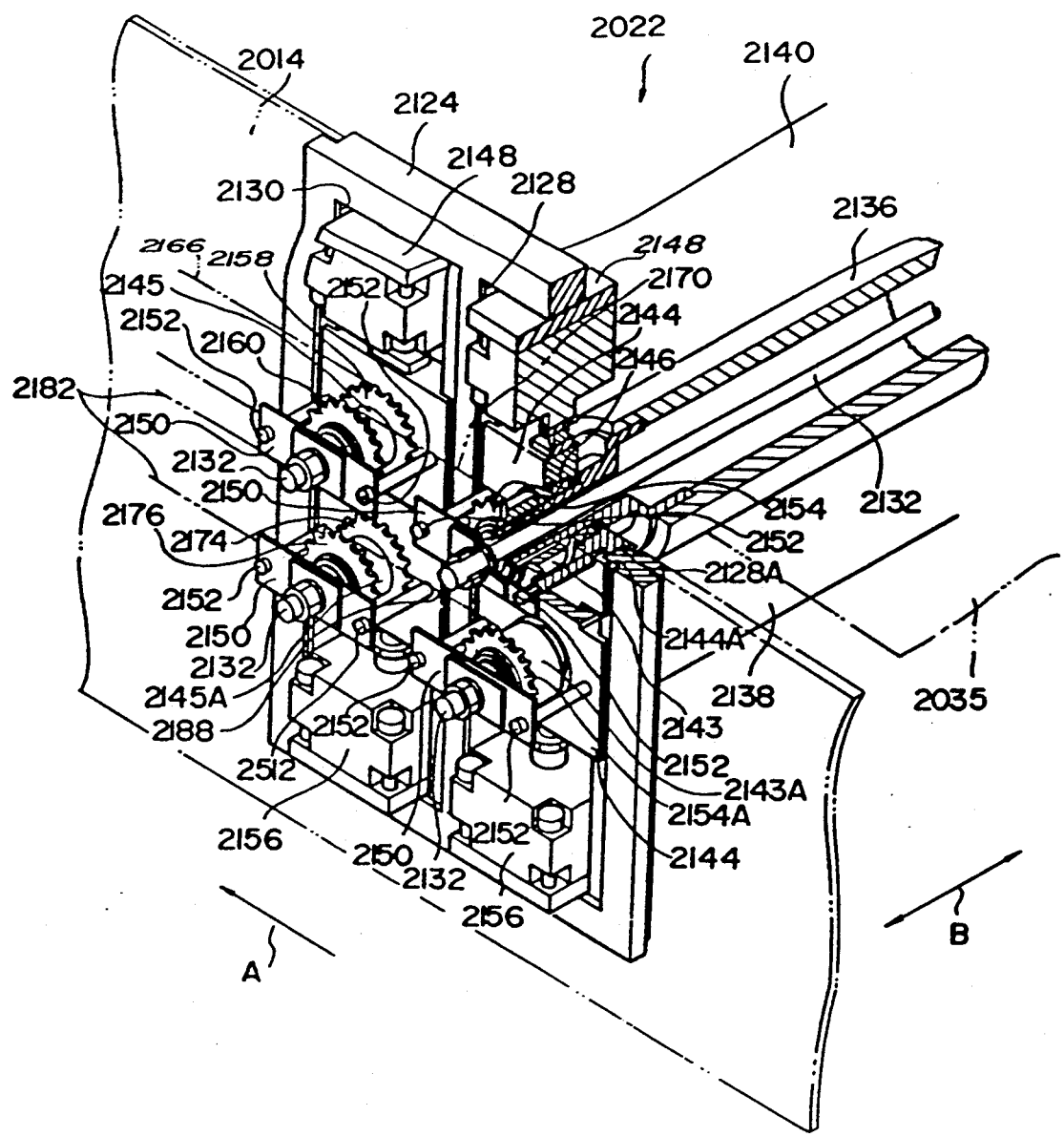

As shown in FIGS. 22 and 23, the transfer station 2022 has frames 2124 and 2126 fixed to the side plates 2014 and 2016, respectively. The frames 2124 and 2126 are each provided with a pair of rectangular openings 2128 and 2130 side by side in the direction of travel of a transporting sheet pair 2034.

Heating transfer rollers 2136, 2138, 2140, and 2142 extend between and are carried by the frames 2124 and 2126.

The heating transfer rollers 2136 and 2138 are disposed in correspondence with the openings 2128 provided in the frames 2124 and 2126, the former heating transfer roller 2136 being disposed in correspondence with an upper portion of the respective opening 2128 and the latter heating transfer roller 2138 being disposed in correspondence with a lower portion of the respective opening 2128. A transporting sheet assembly 2035 is inserted into a nip between the heating transfer rollers 2136 and 2138.

The structures for supporting the heating transfer rollers 2136 and 2138 to the frames 2124 and 2126 are the same, and a description will first be given of the structure for supporting the heating transfer roller 2136 to the frame 2124.

The opposite ends of a rotating shaft of the heating transfer roller 2136 are supported to a pair of support blocks 2144 via bearings 2146. A rod of an air cylinder 2148 supported on an upper inner wall portion of the opening 2128 and the support block 2144 are coupled to each other. A groove 2144A is provided in each side portion of the support block 2144, a projection 2128A provided on each opposing wall of the opening 2128 being inserted in each groove 2144A. As a result, as the air cylinder 2148 is driven, the support block 2144 is capable of moving vertically while being guided by the projections 2128A.

Figure 24:
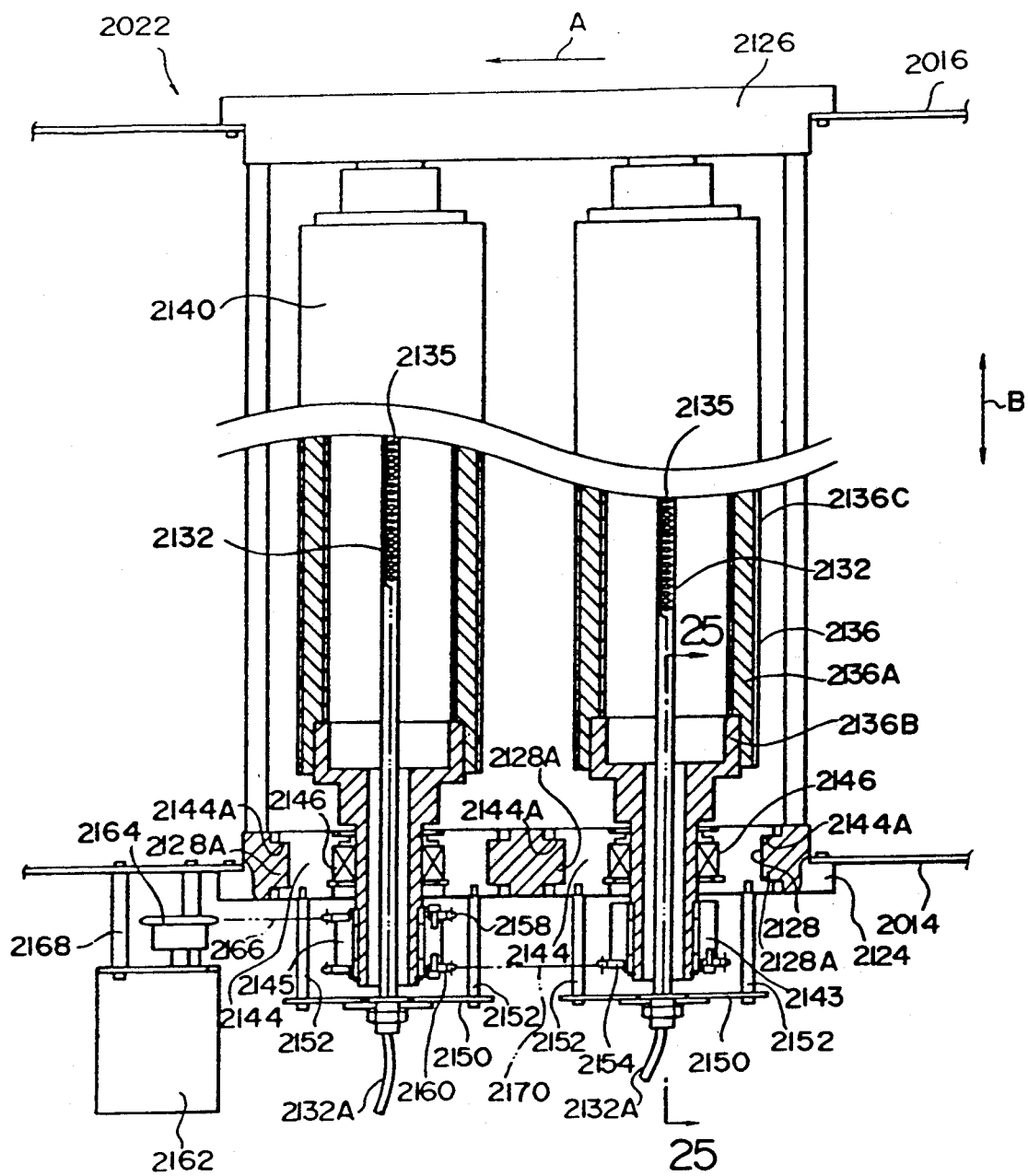
Figure 25:
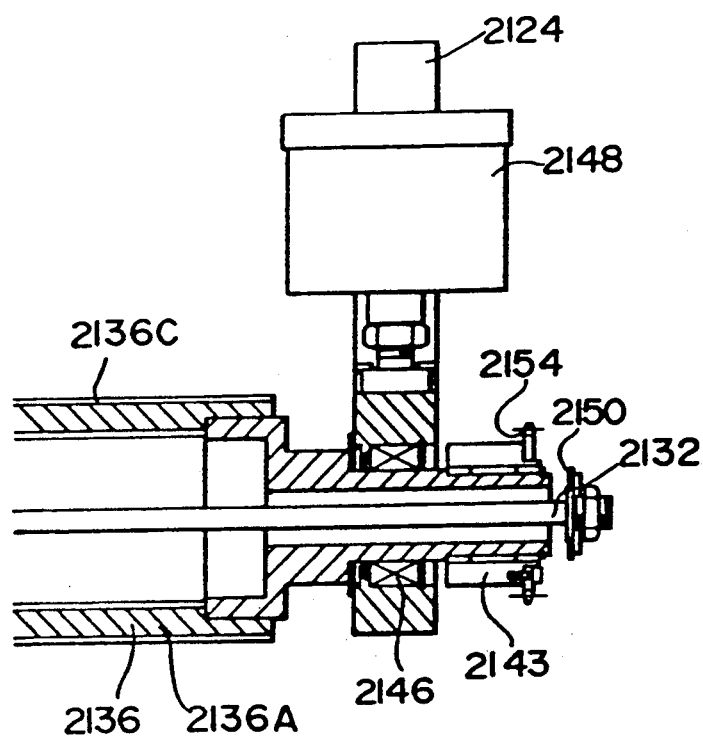
Figure 26:
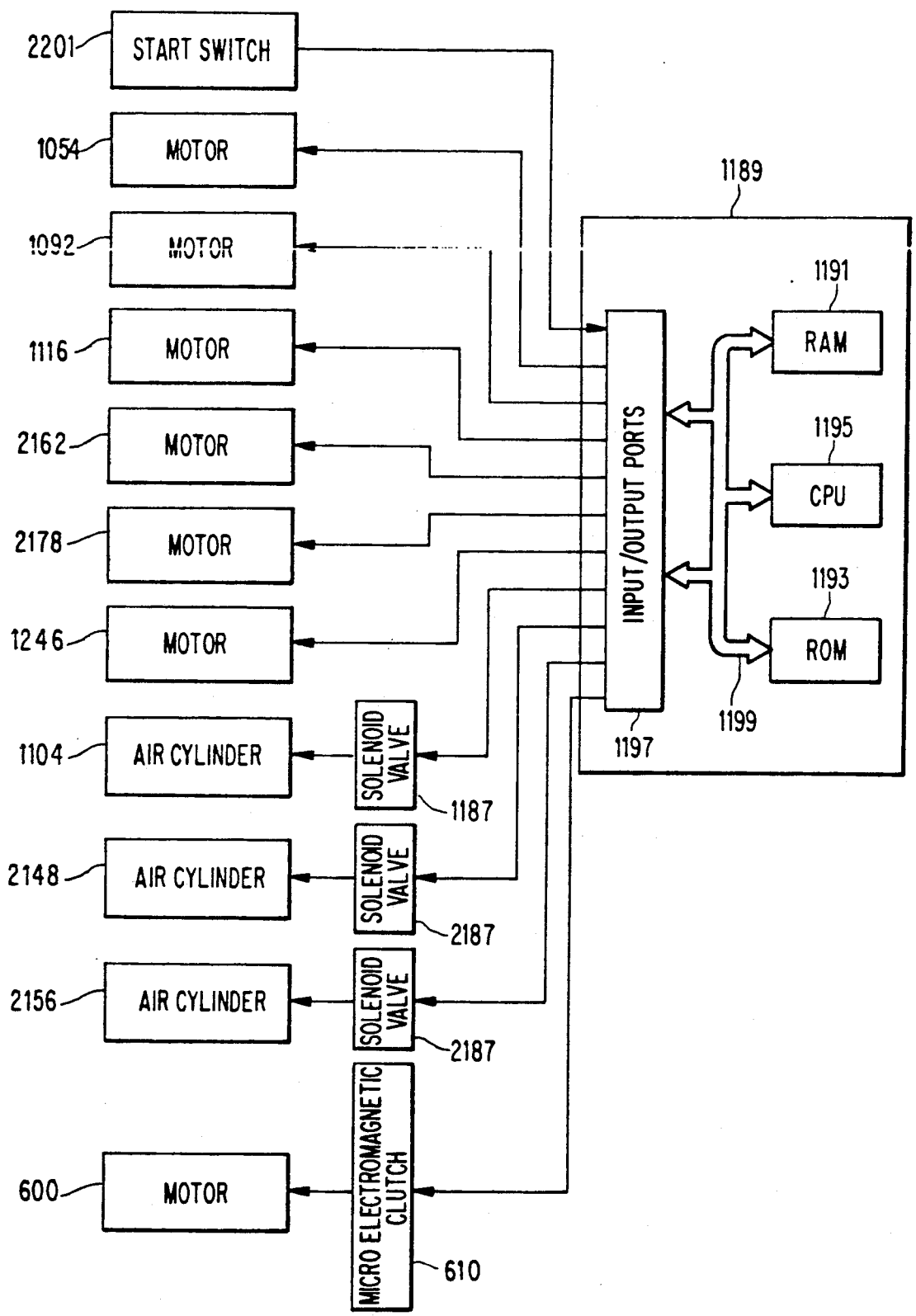

As shown in FIGS. 23, 24, and 25. the heating transfer roller 2136 supported to the support block 2144 has a hollow configuration, a bar heater 2132 being inserted therein. The opposite end portions of the bar heater 2132 project outwardly of the opposite ends of the heating transfer roller 2136 and are supported to support plates 2150 disposed outside the frames 2124 and 2126, respectively.

The support plate 2150 is supported to the support block 2144 via a pair of stays 2152. Between the support block 2144 and the support plate 2150, a sprocket 1154 is fixed to a distal end of the heating transfer roller 2136 via a one-way clutch 2143.

In addition, the heating transfer roller 2138 disposed below the heating transfer roller 2136 is supported in the same manner as the heating transfer roller 2136. The support block 2144 is coupled to a rod of an air cylinder supported on an lower inner wall portion of the opening 2188 provided in the frame 2124, and is vertically movable in the same way as the heating transfer roller 2136. Between the support plate 2150 and the support block 2144, a sprocket 2154A is fixed to an end of a shaft portion of the heating transfer roller 2138 via a one-way clutch 2143A.

Accordingly, when the air cylinders 2148 and 2156 are actuated, the heating transfer rollers 2136 and 2138 move in a mutually approaching direction so as to press and clamp the transporting sheet assembly 2035 for heating.

The heating transfer rollers 2140 and 2142 are disposed in the respective openings 2130 provided in the frames 2124 and 2126 on the downstream side in the direction of travel of the transporting sheet assembly 2035. The heating transfer roller 2140 is disposed in an upper portion of the opening 2130, while the heating transfer roller 2142 is disposed in a lower portion thereof.

The heating transfer roller 2140 penetrate the support block 2144 and project outwardly of the frame 2124. Between the support block 2144 and the support plate 2150, sprockets 2158 and 2160 are fixed to a distal end of the shaft portion thereof via a one-way clutch 2145.

A chain belt 2166 is stretched between and wound around the sprocket 2158 and a sprocket 2164 fixed to a drive shaft of a motor 2162. The motor 2162 is secured to the side plate 2014 via a bracket 2168. Accordingly, the torque of the motor 2162 is transmitted to the sprocket by means of the chain belt 2166 to rotate the heating transfer roller 2140.

In addition, a chain belt 2170 is stretched between and wound around the sprocket 2160 and the sprocket 2154 on the side of the heating transfer roller 2136, so that the torque of the motor 2162 transmitted to the heating transfer roller 2140 via the sprocket 2158 is transmitted to the heating transfer roller 2136.

Furthermore, between the support block 2144 and the support plate 2150, the heating transfer roller 2142 disposed below the heating transfer roller 2140 is provided with sprockets 2174 and 2176 fixed to a distal end of the shaft portion of the heating transfer roller 2142 via a one-way clutch 2145A. A chain belt 2182 is stretched between and wound around the sprocket 2174 and a sprocket 2180 secured to a drive shaft of a motor 2178 disposed below the motor 2162. The motor 2178 is secured to the side plate 2014 via a bracket 2184. Accordingly, the torque of the motor 2178 is transmitted to the heating transfer roller 2142 by means of the chain belt 2182 so as to rotate the heating transfer roller 2142.

Also, a chain belt 2188 is trained between the sprockets 2176 and 2154A, so that the torque transmitted to the heating transfer roller 2142 is in turn transmitted to the heating transfer roller 2138.

In this case, the outside diameter of the heating transfer roller 2142 is set to be equal to or greater than the outside diameter of the heating transfer roller 2138. Hence, when the heating transfer rollers 2142 and 2138 rotate by means of the motor 2178, the peripheral speed of the heating transfer roller 2142 is equal to or greater than the peripheral speed of the heating transfer roller 2138. In addition, the motor 2162 or its drive transmitting mechanism is set in such a manner that the peripheral speeds of the heating transfer rollers 2136 and 2140 located on the upper side of the transporting passage for the transporting sheet assembly 2035 are equal to or less than the peripheral speed of the heating transfer roller 2138 located on the lower side of the transporting passage. Accordingly, the transporting sheet assembly 2035 transported to the heating transfer rollers 2136, 2138, 2140, and 2142 is transported in a horizontal state, or a slightly stretched state, without any slackening between the heating transfer rollers 2136 and 2138 on the upstream side of the heating transfer rollers 2140 and 2142. However, in cases where the tensile force is strong, the one-way clutches 2143, 2143A, and 2145 operate, and the torque of the heating transfer roller 2142 is directly transmitted to the heating transfer rollers 2136, 2138, and 2140 via the transporting sheet assembly 2035. Consequently, the peripheral speeds of the heating transfer rollers 2136, 2138, and 2140 become identical with that of the heating transfer roller 2142. Hence, since the transporting sheet pair 2034 is transported at the same speed, no slippage occurs between the image sheet and the image-receiving sheet.

The heating transfer rollers 2136, 2138, 2140, and 2142 are respectively provided with unillustrated covers fixed to the frames 2124 and 2126 via brackets. Further, a cover 2196 is provided to cover all of these components so as to shield them from the outside. This prevents the heat of the heating transfer rollers 2136, 2138, 2140, and 2142 from being dissipated.

Figure 27:
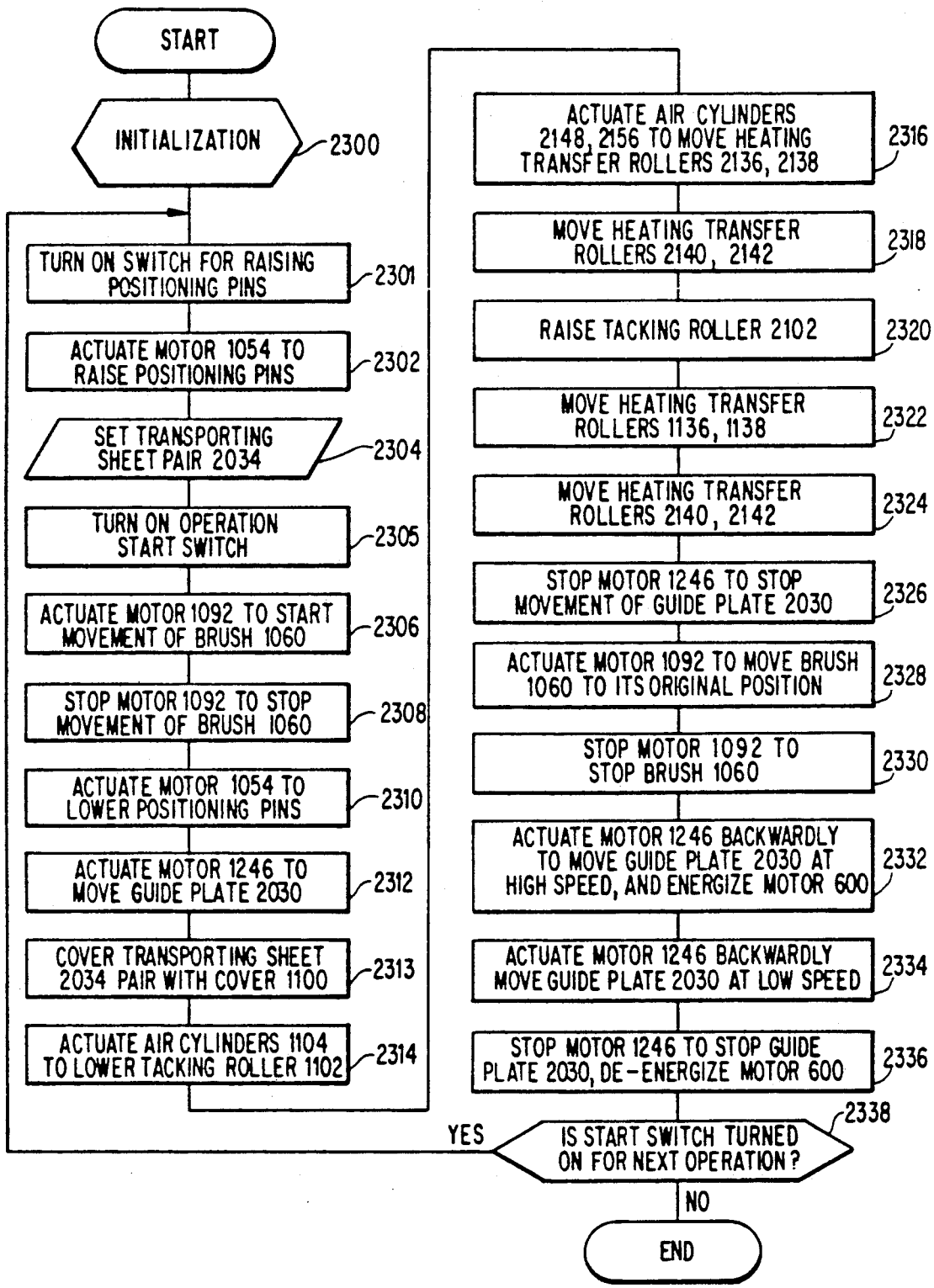

Referring now to a flowchart shown in FIG. 27, a description will be given of the operation of this embodiment.

When the image transfer apparatus 2010 is turned on by means of a start switch, the initialization of the image transfer apparatus 2010 is executed in Step 2300. As a result of this execution, the guide plate 2030 moves to its predetermined position in the working station 2018, while the positioning pins 1040 move to their lower predetermined position. The brush 1060 is positioned on the insertion side of the transporting sheet pair 2034. The tacking roller 1102 moves upwardly by means of the air cylinders 1104 and is brought into pressure contact with the heat roller 1110. The heating transfer rollers 2136 and 2138 have been moved so as to be spaced apart from each other by means of the air cylinders 2148 and 2156. Also, the heating transfer rollers 2140 and 2142 have been moved so as to be spaced apart from each other by means of the air cylinders 2148 and 2156. That is, this is an open state in which the transporting passage for the transporting sheet assembly 2035 is open.

In this state, the motors 2162 and 2178 are started to rotate the heating transfer rollers 2136, 2138, 2140, and 2142.

Furthermore, the fans 1200 start operating to circulate air to the receiving station 2024. Meanwhile, the respective heaters start heating the heating transfer rollers 2136, 2138, 2140, and 2142.

When the temperatures of the heat roller 1110 and the heating transfer rollers 2136, 2138, 2140, and 2142 have risen, regulated, and reached a state permitting tacking and transfer, the start switch for raising the positioning pins 1040 is turned on (Step 2301).

In this state, in Step 2302, the motor 1054 is actuated, and the flat bar 1042 as well as the positioning pins 1040 are raised. As a result, the flat bar 1042 is inserted into the opening 1036 formed in the working table 1029, and the positioning pins 1040 project through the through holes 2030A of the guide plate 2030 and above the guide plate 2030. It should be noted that the cover sheet 1100 fixed to the guide plate 2030 has been taken up in advance onto the takeup roller 602 through the energization of the motor 600. This taking-up operation may also be effected by manually rotating the takeup roller 602. After the taking-up operation, the motor 600 is set in a non-energized state. The image sheet 2026 and the image-receiving sheet 2028 in a superposed state are placed on the guide plate 2030 by allowing their positioning holes 2028A and positioning holes 2026A to be received by the positioning pins 1040 for setting. In this case, the image sheet 2026 and the image-receiving sheet 2028 can be readily positioned by using the positioning pins 1040.

After the transporting sheet pair 2034 is set on the working table 1029 in Step 2304, the unillustrated start switch is turned on by the operator in Step 2305.

In Step 2306, the motor 1092 is actuated, and the brush 1060 starts moving from the inserted side of the transporting sheet pair 2034 toward the other side thereof. As a result, air remaining between the image sheet 2026 and the image-receiving sheet 2028 is eliminated.

When the brush 1060 moves to a position immediately located before the tacking station 2020, the operation of the motor 1092 is stopped and the movement of the brush 1060 stops in Step 2308.

Subsequently, in Step 2310, the motor 1054 is actuated to lower the positioning pins 1040. As a result, the positioning pins 1040 come off the guide plate 2030. In Step 2312, the motor 1246 is actuated, so that the guide plate 2030 moves toward the tacking station 2020 over the working table 1029.

In this case, in Step 2313, as the transporting sheet pair 2034 is transported, the motor 600 is set in a non-energized state, and the cover sheet 1100 taken up by the takeup device 2019 is gradually drawn out to cover the transporting sheet pair 2034.

When the guide plate 2030 approaches the tacking station 1020, an unillustrated sensor detects the guide plate 2030, and in Step 2314, the air cylinder 1104 is actuated, and the tacking roller 1102 is lowered. The transporting sheet pair 2034, beginning with a leading end thereof, is pressed and tacked by the tacking roller 1102 via the cover sheet 1100. It should be noted that when the tacking roller 1102 is positioned upwardly by means of the air cylinders 1104, the tacking roller 1102 abuts against the heat roller 1110, and is thus heated thereby.

Since the tacking roller 1102 is formed into the configuration of a skewer-type roller, a plurality of tacking positions are provided along the direction of travel of the transporting sheet assembly 2035. For this reason, air between the adjacent tacking positions is liable to be removed in the backward direction with respect to the direction of travel. This air is pushed out when the transporting sheet assembly 2035 is transported in a clamped state by the heating transfer rollers 2136 and 2138 in an ensuing Step 2316, so that bubbles do not form between the image sheet and the image-receiving sheet during transfer.

In Step 2316, the air cylinders 2148 and 2156 are actuated, so that the heating transfer roller 2136 is lowered, while the heating transfer roller 2138 is raised. As a result, the transporting passage for the transporting sheet assembly 2035 is closed. The transporting sheet assembly 2035 is inserted into a nip between the heating transfer rollers 2136 and 2138. Then, in Step 2318, the air cylinders 2148 and 2156 on the downstream side are actuated to move the heating transfer rollers 2140 and 2142, closing the transporting passage for the transporting sheet assembly 2035. The transporting sheet assembly 2035 sent out from the heating transfer rollers 2136 and 2138 is inserted into a nip between the heating transfer rollers 2140 and 2142. In this manner, the image on the image sheet 2026 is transferred to the image-receiving sheet 2028 while the transporting sheet assembly 2135 is being pressed and clamped by the heating transfer rollers 2136 and 2138 and the heating transfer rollers 2140 2142 and while simultaneously being transported.

Since the outside diameter of the heating transfer roller 2142 is set to be equal to or greater than that of the heating transfer roller 2138, the peripheral speeds of the heating transfer rollers 2140 and 2142 are faster than those of the heating transfer rollers 2136 and 2138. In addition, the motor 2162 or its drive transmitting mechanism is set in such a manner that the peripheral speeds of the heating transfer rollers 2136 and 2140 located on the upper side of the transporting passage for the transporting sheet assembly 2035 become equal to or less than the peripheral speed of the heating transfer roller 2142 located on the lower side of the transporting passage. Accordingly, when the transporting sheet assembly 2035 is clamped by the heating transfer rollers 2140 and 2142 in a state in which it is clamped by the heating transfer rollers 2136 and 2138, the transporting sheet assembly 2035 is transported in a horizontal state or a slightly stretched state without any slackening. However, in cases where the tensile force is strong, the one-way clutches 2143, 2143A, and 2145 act on the heating transfer rollers 2136, 2138, and 2140, so that torque is not imparted to these heating transfer rollers. Hence, the heating transfer rollers 2136, 2138, and 2140 rotate at the same peripheral speeds as that of the heating transfer roller 2142 via the transporting sheet assembly 2035, i.e., synchronization is obtained. Also in the transporting drive system 1202 for transporting the transporting sheet assembly 2035, this transporting system is adapted to synchronize with the heating transfer roller 2142 by virtue of the action of the one-way clutch 1252. Hence, no slippage occurs between the image sheet 2026 and the image-receiving sheet 2028.

After the transporting sheet assembly 2035 has passed through the tacking station 2020, the tacking roller 1102 is raised in Step 2320. In Steps 2322 and 2324, the heating transfer rollers 2136 and 2138 as well as the heating transfer rollers 2140 and 2142 are moved to open the transporting passage for the transporting sheet assembly 2035.

In this case, the transporting sheet assembly 2035 is transported by the motors 2162 and 2178 after it has been transported to the transfer station 2022 by the motor 1246. That is, the transporting speed derived from the torque of the motors 2162 and 2178 is set to be higher than the transporting speed derived from the torque of the motor 1246, and since coupling is provided via a one-way clutch 2254, the transporting sheet assembly 2035 is transported by the motors 2162 and 2178 for driving the heating transfer rollers 2136, 2138, 2140, and 2142 during heating transfer.

In Step 2326, at the point when the transporting sheet assembly 2035 has been sent out from the transfer station 2022, the motor 1246 is stopped, thereby stopping the movement of the guide plate 2030. At this time, the transporting sheet assembly 2035 has moved to the receiving station 2024, and the transporting sheet assembly 2035 whose temperature has become high by being heated in the transfer station 2022 is cooled in the receiving station 2024.

In Step 2328, the motor 1092 is actuated, and the brush 1060 starts moving toward its original position. In Step 2330, the motor 1092 is driven backwardly, so that the brush 1060 moves toward the insertion side of the transporting sheet assembly 2035.

Then, in Step 2332, the motor 1246 is driven backwardly, so that the guide plate 2030 moves to the working station 2018 at high speed. At the same time, the motor 600 is energized to rotate the takeup roller 602, so that the cover sheet 1100 is taken up onto the takeup roller 602 as the guide plate 203 moves. The guide plate 2030, which has moved to the end of the working station 2018 at high speed, moves at low speed in Step 2334, and stops in Step 2336. Concurrently, the energization of the motor 600 is stopped, so that the taking up of the cover sheet 1100 by the takeup roller 602 is ended.

This completes transfer. In this embodiment as well, since the cover sheet 1100 is taken up by the takeup device 2019 during its movement from the receiving station 1024 to the working station 2018, in the same way as the first embodiment, the operator need not tuck up the cover sheet 1100 for the guide plate 2030, and it suffices to merely remove the image-receiving sheet 2028 from the guide plate 2030 after exfoliating the base layer of the image sheet 2026 from the image-receiving sheet 2028.

Then, in Step 2338, the operator judges whether the process is to return to a series of steps starting with Step 2300 or if the operation is to be ended. That is, a determination is made as to whether an image-receiving sheet and an image sheet have been set anew and the start button has been turned on. If the start switch has not been turned on, the foregoing operation is ended. If the start switch has been turned on, the process returns to the series of steps starting with Step 2300, and the ensuing steps are executed.

It should be noted that although in this embodiment a description has been given of an arrangement in which the transporting sheet assembly 2035 is subjected to tacking by the fixed-type tacking roller 1102 during transport, a similar advantage can be obtained in a method in which the tacking roller 1102 is made to travel and a stationary transporting sheet assembly 2035 is subjected to tacking.

As described above, in this embodiment as well, since the cover sheet 1100 remains rolled up in the takeup device 19 other than when the transporting sheet pair is transported, in the same way as the first embodiment, it is unnecessary for the operator to manually handle the cover sheet 1100 on the working station 2018, and the operator's operation is not hampered by the cover sheet 1100. Hence, the cover sheet 1100 is prevented from becoming damaged or stained due to the handling of the cover sheet 1100.

What is claimed is:

1. An image transfer apparatus for transferring an image recorded on an image sheet to an image-receiving sheet, comprising:

transporting means for transporting a guide plate, on which the image sheet and the image-receiving sheet superposed one above the other is placed, along a transporting passage in a first direction, and for transporting the same along said transporting passage in a second direction which is opposite to said first direction;

a transfer station disposed in an intermediate portion of said transporting passage and adapted to transfer the image recorded on the image sheet to the image-receiving sheet as said guide plate, transported in said first direction and in said second direction, passes therethrough; and a takeup device having a cover sheet disposed on an inserting side, as viewed in said first direction, of said transfer station in the vicinity of said transporting passage, said cover sheet being adapted to be drawn out of said takeup device with the transport of said guide plate as said guide plate is transported in said first direction so as to cover the image sheet and the image-receiving sheet on said guide plate, said cover sheet being adapted to be taken up into said takeup device with the transport of said guide plate as said guide plate is transported in said second direction so as to expose the image sheet and the image-receiving sheet on said guide plate.

2. An image transfer apparatus according to claim 1, wherein said takeup device comprises a takeup roller for taking up said cover sheet, one end portion of said cover sheet being secured to a leading end portion, as viewed in the first direction, of said guide plate, and another end portion of said cover sheet which is opposite to said one end portion, being supported by said takeup roller.

3. An image transfer apparatus according to claim 2, wherein said takeup device further comprises urging means for urging said takeup roller in a direction of taking up said cover sheet.

4. An image transfer apparatus according to claim 3, wherein said urging means comprises a spring incorporated in said takeup roller so as to urge said takeup roller in the taking-up direction.

5. An image transfer apparatus according to claim 4, wherein said takeup device further comprises guiding means for smoothly guiding said cover sheet when said cover sheet is taken up onto and drawn out from said takeup roller.

6. An image transfer apparatus according to claim 5, wherein said guiding means comprises a guide roller for abutting against one surface of said cover sheet so as to rotate when said cover sheet is taken up onto and drawn out from said takeup roller.

7. An image transfer apparatus according to claim 6, wherein said guiding means further comprises preventing means for preventing said guide roller from moving with play.

8. An image transfer apparatus according to claim 2, wherein said takeup device comprises driving means adapted to rotate said takeup roller in a direction of taking up said cover sheet when said driving means is operative, and to permit the rotation of said takeup roller in a direction of drawing out said cover sheet when said driving means is nonoperative.

9. An image transfer apparatus according to claim 8, wherein said driving means comprises a motor for rotating said takeup roller in the direction of taking up said cover sheet when said motor is energized, and clutch means for disengaging said motor from said takeup roller when said motor is not energized, and for permitting the rotation of said takeup roller in the direction of drawing out said cover sheet.

10. An image transfer apparatus according to claim 9, wherein said takeup device further comprises guiding means for smoothly guiding said cover sheet when said cover sheet is taken up onto and drawn out from said takeup roller.

11. An image transfer apparatus according to claim 10, wherein said guiding means comprises a guide roller for abutting against one surface of said cover sheet so as to rotate when said cover sheet is taken up onto and drawn out from said takeup roller.

12. An image transfer apparatus for transferring an image recorded on an image sheet to an image-receiving sheet wherein the image sheet and the image-receiving sheet, placed one above the other on a guide plate, together with said guide plate and a cover sheet having one end secured to said guide plate for covering the image sheet and the image-receiving sheet, are transported from a side proximate said one end along a transporting passage and passed through a transfer station, and are subsequently transported from an opposite side to said one end along the transporting passage and are passed again through said transfer station, said image transfer apparatus comprising: a takeup device disposed at a predetermined position on a side of said transfer station which is the same side as said opposite side, so as to support and opposite end of said cover sheet which is opposite said one end of said cover sheet, said takeup device being adapted to allow said cover sheet to be drawn out, beginning with said side thereof, with the transport of said guide plate as the image sheet and the image-receiving sheet are transported from said one end portion so as to cover the image sheet and the image-receiving sheet on said guide plate, said takeup device also being adapted to take up said cover sheet beginning with said opposite side thereof with the transport of said guide plate as the image sheet and the image-receiving sheet are transported from said opposite side.

13. An image transfer apparatus according to claim 12, wherein said takeup device comprises a takeup roller for supporting said opposite end of said cover sheet, and driving means for rotating said takeup roller.

14. An image transfer apparatus according to claim 13, wherein said driving means comprises urging means for constantly urging said takeup roller in a direction of taking up said cover sheet.

15. An image transfer apparatus according to claim 14, wherein said urging means comprises a spring incorporated in said takeup roller and set in an urging state.

16. An image transfer apparatus according to claim 13, wherein said driving means comprises a motor.

17. An image transfer method for transferring an image recorded on an image sheet to an image-receiving sheet wherein the image sheet and the image-receiving sheet, placed one above the other on a guide plate, together with said guide plate and a cover sheet, having one end secured to said guide plate, for covering the image sheet and the image-receiving sheet, are transported from a side of said one end along a transporting passage and passed through a transfer station. and are subsequently transported from an opposite side to said one end along the transporting passage and are passed again through said transfer station, said image transfer method comprising the steps of:

drawing out, at a predetermined position on a side of said transfer station which is the same side as said opposite side, said cover sheet beginning with said one end thereof with the transport of said guide plate as the image sheet and the image-receiving sheet are transported from said side so as to cover the image sheet and the image-receiving sheet; and taking up, at said predetermined position, said cover sheet beginning with an opposite end portion thereof with the transport of said guide plate as the image sheet and the image-receiving sheet are transported from said opposite side.

18. An image transfer method according to claim 17, wherein said cover sheet is taken up in advance by a takeup roller disposed at said predetermined position prior to transport from said one end portion side, and is taken up by said takeup roller at the time of transport from said opposite side.

19. An image transfer method according to claim 18, wherein said takeup roller is urged in a taking-up direction.

20. An image transfer method according to claim 18, wherein said cover sheet is drawn out from said takeup roller by a transporting force acting on said guide plate prior to transport from said one end portion side, and is taken up onto said takeup roller by the torque of a motor during transport from said opposite side.

* * * * *